(12) United States Patent
Kuper et al.

(10) Patent No.: US 10,048,321 B2
(45) Date of Patent: Aug. 14, 2018

(54) SYSTEMS AND METHODS FOR DIRECTIONAL CAPACITY ESTIMATION OF A RECHARGEABLE BATTERY

(71) Applicant: Johnson Controls Technology Company, Holland, MI (US)

(72) Inventors: Christian Kuper, Barsinghausen (DE); Qingzhi Guo, Brookfield, WI (US); Timur L. Aliyev, Chicago, IL (US)

(73) Assignee: Johnson Controls Technology Company, Auburn Hills, MI (US)

( * ) Notice: Subject to any disclaimer, the term of this patent is extended or adjusted under 35 U.S.C. 154(b) by 188 days.

(21) Appl. No.: 15/048,853

(22) Filed: Feb. 19, 2016

(65) Prior Publication Data

US 2017/0242078 A1    Aug. 24, 2017

(51) Int. Cl.
*G01R 31/36* (2006.01)

(52) U.S. Cl.
CPC ....... *G01R 31/3651* (2013.01); *G01R 31/361* (2013.01); *G01R 31/3679* (2013.01)

(58) Field of Classification Search
CPC combination set(s) only.
See application file for complete search history.

(56) References Cited

U.S. PATENT DOCUMENTS

| 6,534,954 | B1 | 3/2003 | Plett et al. |
| 6,927,554 | B2 | 8/2005 | Tate, Jr. et al. |
| 7,768,233 | B2 | 8/2010 | Lin et al. |
| 2012/0306450 | A1 | 12/2012 | Nakayama et al. |
| 2016/0131720 | A1 | 5/2016 | Baba et al. |

OTHER PUBLICATIONS

Verugge and Tate, "Adaptive state of charge algorithm for nickel metal hydride batteries including hysteresis phenomena", Journal of Power Sources 126 (2004), pp. 236-249.
C. Hu, B. D. Youn, and J. Chung, "A rnultiscale framework with extended Kalman filter for lithium-ion battery SOC and capacity estimation", Applied Energy 92 (2012), pp. 694-704.
Youmin Zhang and X. Rong Li, "A Fast U-D Factorization-Based Learning Algorithm with Applications to Nonlinear System Modeling and Identification", IEEE Transactions on Neural Networks, vol. 10, No. 4, Jul. 1999.
Bengt Carlsson, "Recursive identification", Uppsala Universitet Institutionen För Informationsteknologi.

(Continued)

*Primary Examiner* — Robert Bachner
(74) *Attorney, Agent, or Firm* — Fletcher Yoder, P.C.

(57) ABSTRACT

A battery system includes a battery that couples to an electrical system. The battery system also includes a battery control module that electrically couples to the battery. The battery control module performs a parallel current integration process on an initial state of charge using an actual capacity and a candidate capacity of the battery. Additionally, the battery control module performs a directional comparison between an estimated state of charge of the battery and results of the parallel current integration process. Further, the battery control module determines validity of the estimated state of charge based at least in part on the directional comparison between the estimated state of charge of the battery and the results of the parallel current integration process.

23 Claims, 12 Drawing Sheets

(56) References Cited

OTHER PUBLICATIONS

Xidong Tang, Xiaofeng Mao, Jian Lin, and Brian Koch, "Capacity Estimation for Li-ion Batteries", 2011 American Control Conference, Jun. 29-Jul. 1, 2011: pp. 947-952.
Xidong Tang, Xiaofeng Mao, Jian Lin, and Brian Koch, "Li-ion Battery Parameter Estimation for State of Charge", 2011 American Control Conference, Jun. 29-Jul. 1, 201, pp. 941-946.
Dazhibg mu, Jiuchun Jiang, and Caiping Zhang,"Online Semiparametric Identification of Lithium-Ion Batteries Using the Wavelet-Based Partially Linear Battery Model", Energies 2013, vol. 6 May 21, 2013, pp. 2583-2604.
PCT/US2016/045044 International Search Report and Written Opinion dated Nov. 15, 2016.

SYSTEMS AND METHODS FOR DIRECTIONAL CAPACITY ESTIMATION OF A RECHARGEABLE BATTERY

BACKGROUND

The present disclosure generally relates to the field of batteries and battery modules. More specifically, the present disclosure relates to estimating and verifying real-time parameters of a rechargeable battery.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved state indicators for battery modules of such vehicles. For example, the electric power used by the xEVs may be provided by rechargeable batteries. It may be difficult to accurately depict a state of charge or capacity of the rechargeable batteries while the rechargeable batteries are in operation. The present disclosure is generally related to estimating and verifying real-time parameters of the rechargeable battery during operation of the rechargeable battery and/or the xEV.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a battery system that includes a battery that couples to an electrical system. The battery system also includes a battery control module that electrically couples to the battery. The battery control module performs a parallel current integration process on an initial state of charge using an actual capacity and a candidate capacity of the battery. Additionally, the battery control module performs a directional comparison between an estimated state of charge of the battery and results of the parallel current integration process. Further, the battery control module determines validity of the estimated state of charge based at least in part on the directional comparison between the estimated state of charge of the battery and the results of the parallel current integration process The present disclosure also relates to a method to verify a capacity estimation of a rechargeable battery that couples to an electrical system. The method includes performing a parallel current integration process on an initial state of charge via a battery control module of the rechargeable battery using an actual capacity of the rechargeable battery and a candidate capacity of the rechargeable battery. Additionally, the method includes, directionally comparing an estimated state of charge of the rechargeable battery to results of the parallel current integration process via the battery control module. Further, the method includes determining validity of the estimated state of charge based at least in part on a directional comparison between the estimated state of charge and the results of the parallel current integration process via the battery control module.

The present disclosure also relates to an energy storage component for use in a vehicle. The energy storage component includes a housing, a first terminal and a second terminal, and a rechargeable battery disposed in the housing. The rechargeable battery couples to the first terminal and the second terminal. The energy storage component also includes a battery control module that determines validity of an outcome of a method that determines an estimated capacity of the energy storage component. The battery control module determines the validity by performing a parallel current integration process on an initial state of charge using an actual capacity of the energy storage component and a candidate capacity of the energy storage component. Additionally, the battery control module determines the validity by directionally comparing an estimated state of charge of the energy storage component to results of the parallel current integration process.

DRAWINGS

Various aspects of this disclosure may be better understood upon reading the following detailed description and upon reference to the drawings in which.

DETAILED DESCRIPTION

Figure 1:
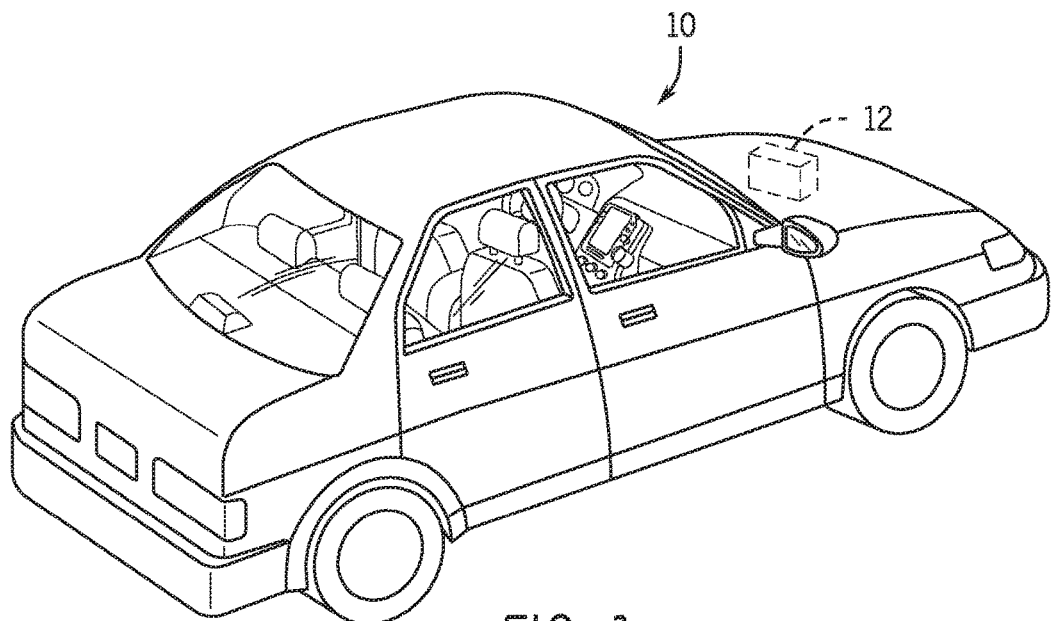
FIG. 1 is perspective view of a vehicle (an xEV) having a battery system contributing all or a portion of the power for the vehicle, in accordance with an embodiment of the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to various types of electric vehicles (xEVs) and other high voltage energy storage/expending applications (e.g., electrical grid power storage systems). Such battery systems may include one or more battery modules, each battery module having a number of battery cells (e.g., lithium-ion (Li-ion) electrochemical cells) arranged and electrically interconnected to provide particular voltages and/or currents useful to power, for example, one or more components of an xEV. As another example, battery modules in accordance with present embodiments may be incorporated with or provide power to stationary power systems (e.g., non-automotive systems).

Based on the advantages over traditional gas-power vehicles, manufactures, which generally produce traditional gas-powered vehicles, may desire to utilize improved vehicle technologies (e.g., regenerative braking technology) within their vehicle lines. Often, these manufacturers may utilize one of their traditional vehicle platforms as a starting point. Accordingly, since traditional gas-powered vehicles are designed to utilize 12 volt battery systems, a 12 volt lithium ion battery may be used to supplement a 12 volt lead-acid battery. More specifically, the 12 volt lithium ion battery may be used to more efficiently capture electrical energy generated during regenerative braking and subsequently supply electrical energy to power the vehicle's electrical system.

As advancements occur with vehicle technologies, high voltage electrical devices may also be included in the vehicle's electrical system. For example, the lithium ion battery may supply electrical energy to an electric motor in a mild-hybrid vehicle. Often, these high voltage electrical devices utilize voltage greater than 12 volts, for example, up to 48 volts. Accordingly, in some embodiments, the output voltage of a 12 volt lithium ion battery may be boosted using a DC-DC converter to supply power to the high voltage devices. Additionally or alternatively, a 48 volt lithium ion battery may be used to supplement a 12 volt lead-acid battery. More specifically, the 48 volt lithium ion battery may be used to more efficiently capture electrical energy generated during regenerative braking and subsequently supply electrical energy to power the high voltage devices.

Thus, the design choice regarding whether to utilize a 12 volt lithium ion battery or a 48 volt lithium ion battery may depend directly on the electrical devices included in a particular vehicle. Nevertheless, although the voltage characteristics may differ, the operational principles of a 12 volt lithium ion battery and a 48 volt lithium ion battery are generally similar. More specifically, as described above, both may be used to capture electrical energy during regenerative braking and subsequently supply electrical energy to power electrical devices in the vehicle.

Accordingly, to simplify the following discussion, the present techniques will be described in relation to a battery system with a 12 volt lithium ion battery and a 12 volt lead-acid battery. However, one of ordinary skill in art is able to adapt the present techniques to other battery systems, such as a battery system with a 48 volt lithium ion battery and a 12 volt lead-acid battery.

The present disclosure relates to batteries and battery modules. More specifically, the present disclosure relates estimating and verifying real-time parameters of rechargeable batteries. Particular embodiments are directed to lithium ion battery cells that may be used in vehicular contexts (e.g., hybrid electric vehicles) as well as other energy storage/expending applications (e.g., energy storage for an electrical grid).

With the preceding in mind, the present disclosure describes techniques for estimating and verifying real-time parameters of the rechargeable batteries. Traditionally, a rated capacity of a rechargeable battery may be determined by completely discharging the rechargeable battery from a fully charged state using a constant discharge rate at room temperature. Such a method may not be practical for rechargeable batteries used in vehicular contexts. Accordingly, a partial discharge of the rechargeable battery may be used to estimate a capacity of the rechargeable battery. Accordingly, a battery control unit described in the present disclosure may estimate and verify the capacity and other parameters of the rechargeable battery in real-time or near real-time using the systems and methods described in detail below.

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
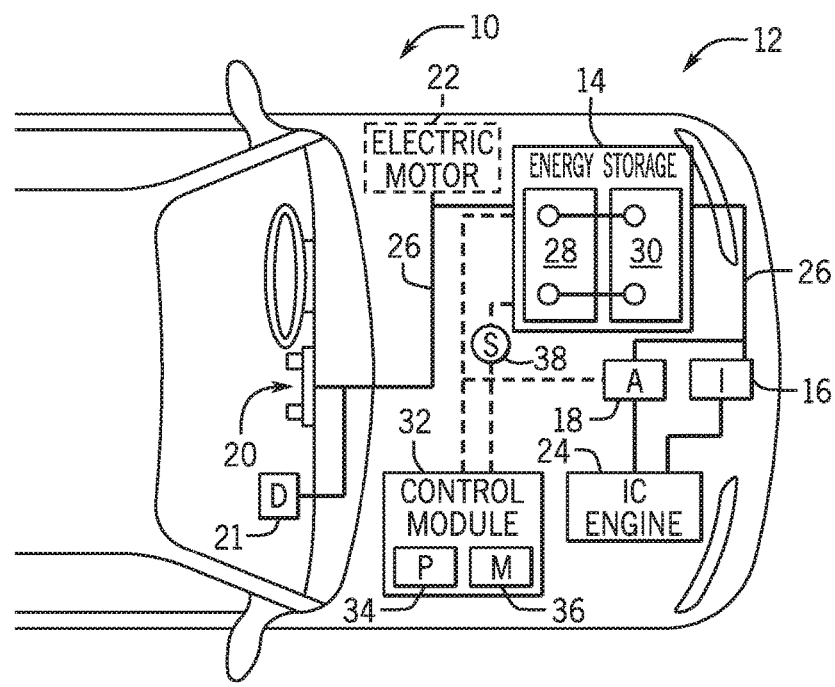
FIG. 2 is a cutaway schematic view of the xEV of FIG. 1 in the form of a hybrid electric vehicle (HEV), in accordance with an embodiment of the present approach.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 14 supplies power to the vehicle console 20, a display 21 within the vehicle, and the ignition system 16, which may be used to start (e.g., crank) an internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator 18 and/or the electric motor 22 are generally referred to herein as a regenerative braking system.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20. Accordingly, when a 12 volt battery system 12 is used, the bus 26 may carry electrical power typically between 8-18 volts.

Additionally, as depicted, the energy storage component 14 may include multiple battery modules. For example, in the depicted embodiment, the energy storage component 14 includes a lead acid (e.g., a first) battery module 28 in accordance with present embodiments, and a lithium ion (e.g., a second) battery module 30, where each battery module 28, 30 includes one or more battery cells. In other embodiments, the energy storage component 14 may include any number of battery modules. Additionally, although the first battery module 28 and the second battery module 30 are depicted adjacent to one another, they may be positioned in different areas around the vehicle. For example, the second battery module 30 may be positioned in or about the interior of the vehicle 10 while the first battery module 28 may be positioned under the hood of the vehicle 10.

In some embodiments, the energy storage component 14 may include multiple battery modules to utilize multiple different battery chemistries. For example, the first battery module 28 may utilize a lead-acid battery chemistry and the second battery module 30 may utilize a lithium ion battery chemistry. In such an embodiment, the performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 32. More specifically, the control module 32 may control operations of components in the battery system 12, such as relays (e.g., switches) within energy storage component 14, the alternator 18, and/or the electric motor 22. For example, the control module 32 may regulate amount of electrical energy captured/supplied by each battery module 28 or 30 (e.g., to de-rate and re-rate the battery system 12), perform load balancing between the battery modules 28 and 30, determine a state of charge of each battery module 28 or 30, determine temperature of each battery module 28 or 30, determine a predicted temperature trajectory of either battery module 28 and 30, determine predicted life span of either battery module 28 or 30, determine fuel economy contribution by either battery module 28 or 30, control magnitude of voltage or current output by the alternator 18 and/or the electric motor 22, and the like.

Accordingly, the control module (e.g., unit) 32 may include one or more processors 34 and one or more memories 36. More specifically, the one or more processors 34 may include one or more application specific integrated circuits (ASICs), one or more field programmable gate arrays (FPGAs), one or more general purpose processors, or any combination thereof. Generally, the processor 34 may perform computer-readable instructions related to the processes described herein. Additionally, the processor 34 may be a fixed-point processor or a floating-point processor.

Additionally, the one or more memories 36 may include volatile memory, such as random access memory (RAM), and/or non-volatile memory, such as read-only memory (ROM), optical drives, hard disc drives, or solid-state drives. In some embodiments, the control module 32 may include portions of a vehicle control unit (VCU) and/or a separate battery control module. Additionally, as depicted, the control module 32 may be included separate from the energy storage component 14, such as a standalone module. In other embodiments, the battery management system 36 may be included within the energy storage component 14.

In certain embodiments, the control module 32 or the processor 34 may receive data from various sensors 38 disposed within and/or around the energy storage component 14. The sensors 38 may include a variety of sensors for measuring current, voltage, temperature, and the like regarding the battery module 28 or 30. After receiving data from the sensors 38, the processor 34 may convert raw data into estimations of parameters of the battery modules 28 and 30. As such, the processor 34 may render the raw date into data that may provide an operator of the vehicle 10 with valuable information pertaining to operations of the battery system 12, and the information pertaining to the operations of the battery system 12 may be displayed on the display 21. The display 21 may display various images generated by device 10, such as a GUI for an operating system or image data (including still images and video data). The display 21 may be any suitable type of display, such as a liquid crystal display (LCD), plasma display, or an organic light emitting diode (OLED) display, for example. Additionally, the display 21 may include a touch-sensitive element that may provide inputs to the adjust parameters of the control module 32 or data processed by the processor 34.

The energy storage component 14 may have dimensions comparable to those of a typical lead-acid battery to limit modifications to the vehicle 10 design to accommodate the battery system 12. For example, the energy storage component 14 may be of similar dimensions to an H6 battery, which may be approximately 13.9 inches×6.8 inches×7.5 inches. As depicted, the energy storage component 14 may be included within a single continuous housing. In other embodiments, the energy storage component 14 may include multiple housings coupled together (e.g., a first housing including the first battery 28 and a second housing including the second battery 30). In still other embodiments, as mentioned above, the energy storage component 14 may include the first battery module 28 located under the hood of the vehicle 10, and the second battery module 30 may be located within the interior of the vehicle 10.

Figure 3:
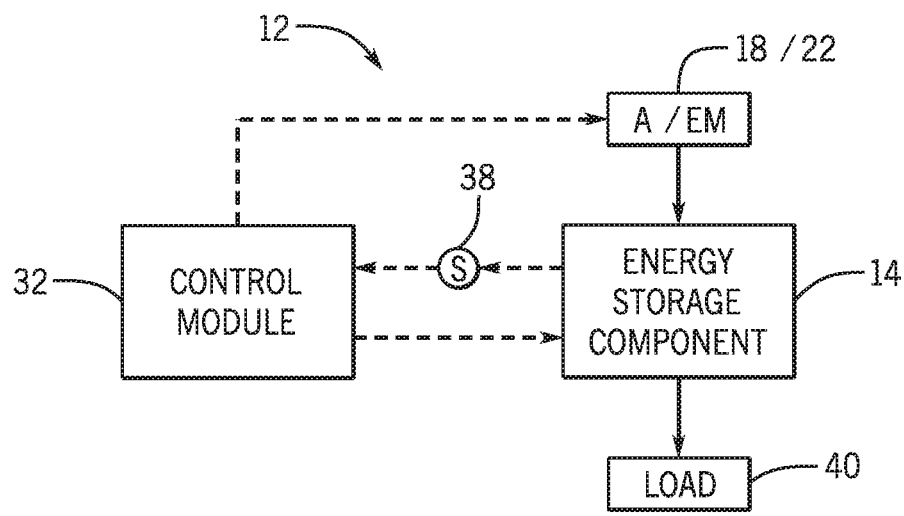
FIG. 3 is a schematic view of a battery system of the xEV of FIG. 1, in accordance with an embodiment of the present approach.

More specifically, FIG. 3 illustrates a schematic view of components of the battery system 12. As mentioned above in the discussion of FIG. 2, the control module 32 may regulate amount of electrical energy captured/supplied by each battery module 28 or 30 (e.g., to de-rate and re-rate the battery system 12), perform load balancing between the battery modules 28 and 30, determine a state of charge of each battery module 28 or 30, determine temperature of each battery module 28 or 30, determine a predicted temperature trajectory of either battery module 28 or 30, determine predicted life span of either battery module 28 or 30, determine fuel economy contribution by either battery module 28 or 30, control magnitude of voltage or current output by the alternator 18 and/or the electric motor 22, and the like. In particular, the control module 32 may enable measurement of the state of charge (SOC) and/or state of health (SOH) based on battery parameters measured by the sensors 38.

In some embodiments, the energy storage component 14 may include a single lithium ion cell or a plurality of lithium ion cells coupled in series. Additionally, other rechargeable battery chemistries are contemplated. The energy storage component 14 may discharge stored energy to a load 40, which may include the ignition system 16, the vehicle console 20, the display 21, the electric motor 22, and any other electric components of the vehicle 10. As the energy storage component 14 discharges the stored energy to the load 40, the alternator 18 and/or the electric motor 22 may provide energy to the energy storage component 14 to replenish the stored energy previously discharged to the load 40. The sensors 38 may measure battery parameters of the energy storage component 14, and the sensors 38 may transmit the measurements to the control module 32. The battery parameters of the energy storage component 14 may include terminal voltage measurements, terminal current measurements, and battery temperature measurements. The control module 32 processes the measured battery parameters, as described in detail below, to estimate the SOC of the energy storage component 14, two resistances associated with an equivalent circuit model of the energy storage component 14, and a capacitance associated with the equivalent circuit model. As discussed below in relation to FIG. 4, the equivalent circuit model may be a 1-RC equivalent circuit model.

Further, it may be appreciated that the systems and methods described herein may be used for varying chemistries of the energy storage component 14. For example, the SOC, the resistances, and the capacitance of the energy storage component 14 may represent a single or multi-cell lithium ion battery, a single or multi-cell lead-acid battery, some combination thereof (e.g., a lithium ion battery electrically coupled in parallel to a lead-acid battery), or any other single or multi-cell battery chemistries. Furthermore, in energy storage components 14 with multiple battery chemistries electrically coupled in parallel, the SOC, the resistances, and the capacitance may represent the entire energy storage component 14, or the SOC, the resistances, and the capacitance may be calculated for each of the multiple battery chemistries.

Figure 4:
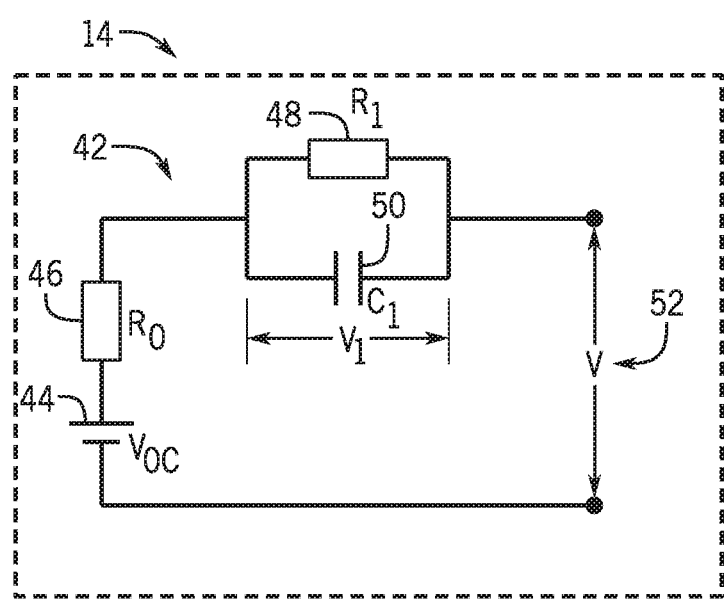
FIG. 4 is a 1-RC equivalent circuit model of an energy storage component of the xEV of FIG. 1, in accordance with an embodiment of the present approach.

FIG. 4 depicts a 1-RC equivalent circuit model 42 of the energy storage component 14. The 1-RC equivalent circuit model 42 relates battery parameters (e.g., open circuit voltage (OCV) 44, resistances 46 and 48, and capacitance 50) to the measured parameters (e.g., terminal voltage 52, terminal current, and battery temperature) measured by the sensors 38. Additionally, the 1-RC equivalent circuit model 42 provides a mechanism to estimate the OCV in real-time during operation of the vehicle 10. Using other methods to measure the OCV, such as a coulomb counting method, the OCV may be measureable when the battery system 12 is at a resting state for an extended amount of time. That is, the OCV of the battery system 12 may be measureable after the battery system 12 has rested for one or more hours. Accordingly, by using the 1-RC equivalent circuit model 42, a rest period is no longer used, and the OCV may be estimated while the battery system 12 operates under the load 40.

In the 1-RC equivalent circuit model 42, the resistance 46 (i.e., $R_0$) represents an ohmic resistance of a current path of the energy storage component 14, the resistance 48 (e.g. $R_1$) represents a charge transfer resistance of the energy storage component 14, and the capacitance 50 (e.g. $C_1$) represents a double layer capacitance of the energy storage component 14. The 1-RC equivalent circuit model 42 is referred to as a 1-RC equivalent circuit model due to the single resistor-capacitor pairing (e.g., the resistance 48 and the capacitance 50). Using the 1-RC equivalent circuit model 42 enables a determination of the OCV 44 during a real-time drive condition of the vehicle 10. In the 1-RC equivalent circuit model 42, the resistances 46 and 48 and the capacitance 50 may generally be time invariant parameters of the energy storage component 14. Alternatively, the OCV 44, which may be used to determine a state of charge of the energy storage component 14, may generally be a time variant parameter of the energy storage component 14. That is, as the energy storage component 14 is charged and discharged over a time, the OCV 44 will increase and decrease over the time.

Figure 5:
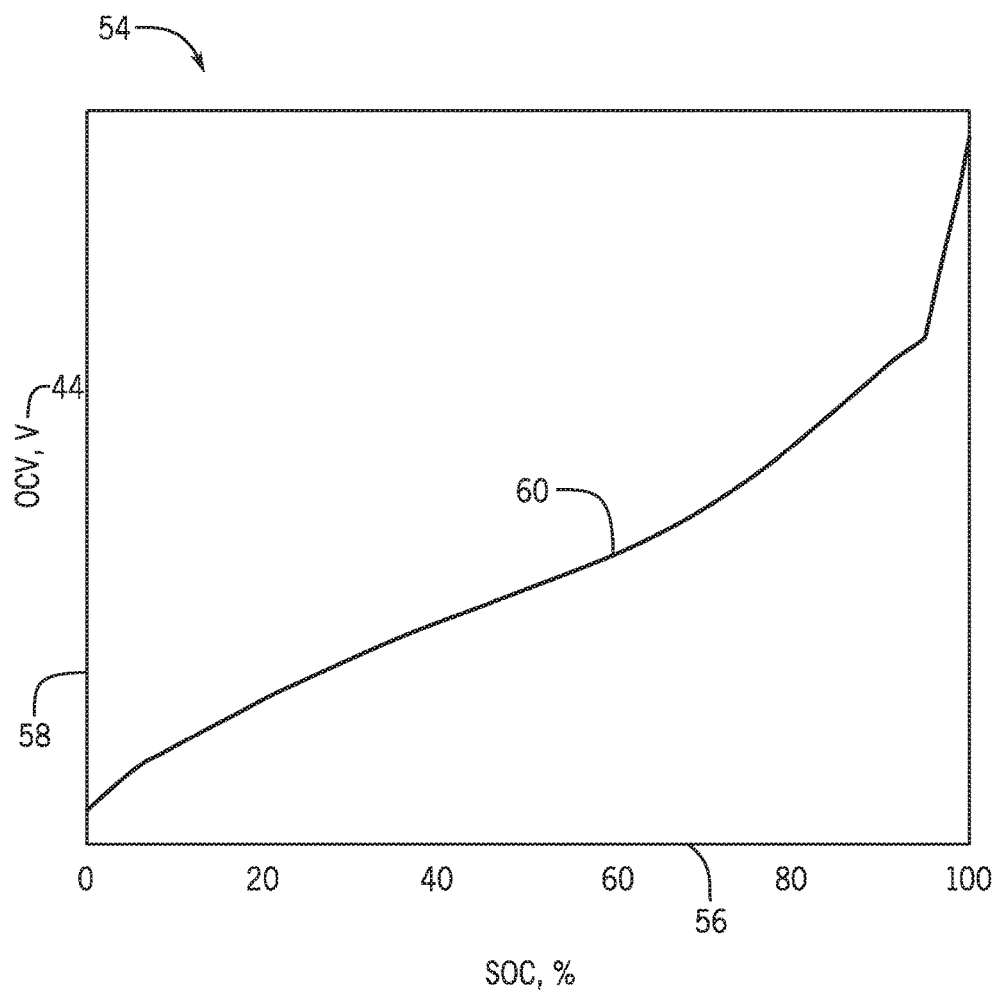
FIG. 5 is a chart of a relationship between an open circuit voltage (OCV) and a state of charge (SOC) of an energy storage component of the xEV of FIG. 1, in accordance with an embodiment of the present approach.

An accurate estimation of the OCV 44, the resistances 46 and 48, and the capacitance 50 may be beneficial to control the energy storage component 14 for a longer battery life and increased fuel efficiency of hybrid-electric vehicles. For example, FIG. 5 illustrates a chart 54 that provides a relationship between the OCV 44 and a state of charge (SOC) of the energy storage component 14. The SOC is displayed as a percentage along an abscissa 56 of the chart 54. Additionally, the OCV 44 is displayed as a voltage along an ordinate 58 of the chart 54. A curve 60 represents the relationship between the OCV 44 and the SOC of the energy storage component 14. For example, the curve 60 may be used as a look-up table to provide an accurate SOC representation of the energy storage component 14. When the OCV 44 of the 1-RC equivalent circuit model 42 is determined based on measured battery parameters, the value of the OCV 44 may be matched with a corresponding SOC percentage. The SOC percentage may provide an operator of the vehicle 10 with an accurate indication of remaining battery life of the energy storage component 14 in real-time during operation of the vehicle 10. Further, it may be appreciated that the OCV 44 changes as the SOC changes. For example, the OCV 44 does not plateau at a voltage when the SOC of the energy storage component 14 is increasing or decreasing.

Returning to a discussion of FIG. 4, the 1-RC equivalent circuit model 42 may be derived initially in discrete time to relate estimations of the OCV 44, the resistances 46 and 48, and the capacitance 50 (i.e., battery parameter estimations) to the measured terminal voltage 52 and the measured current of the energy storage component 14. A Kalman filter is used for this relationship to determine the battery parameter estimations from the measured terminal voltage 52 and the measured current. Using the Kalman filter, the control module 32 may update the battery parameter estimations in real-time with limited reliance on pre-defined battery parameters.

A voltage 52 (e.g., V) of the energy storage component 14 may be calculated by the Duhamel superposition theorem for any arbitrary current source I:

$$V = V_{OC} - IR_0 - \frac{1}{C_1}\int_{\xi=0}^{\xi=t} I(\xi)\exp\left(-\frac{t-\xi}{R_1 C_1}\right)d\xi \quad (1)$$

where $\xi$ is a dummy variable of integration. The first two terms on the right side of equation 1 (i.e., $V_{OC}$ and $IR_0$) give rise to an ohmic description of the energy storage component 14, as the voltage 52 is related to the OCV 44 reduced by the ohmic drop $IR_0$. Further, the third term on the right side of equation 1 corresponds to a superposition integral, through which past currents influence the OCV 44 beyond the first-order effect of changing an average SOC characterizing the energy storage component 14. Because of an exponential weighting function, the impact of older current-potential data points is exponentially less than that of recent data points.

Equation 1 may be evaluated at two arbitrary time steps, $t_{k-1}$ and $t_k$, to yield:

$$V_k = V_{OC} - I_k R_0 - \frac{1}{C_1}\int_{\xi=0}^{\xi=t_k} I(\xi)\exp\left(-\frac{t_k-\xi}{R_1 C_1}\right)d\xi \quad (2)$$

and $$V_{k-1} = V_{OC} - I_{k-1} R_0 - \frac{1}{C_1}\int_{\xi=0}^{\xi=t_{k-1}} I(\xi)\exp\left(-\frac{t_{k-1}-\xi}{R_1 C_1}\right)d\xi \quad (3)$$

It may be assumed that the battery current and voltage are measured at a fixed time interval, for example:

$$t_{k-1}-t_k \equiv \Delta t, \forall \text{ all } k \quad (4)$$

Accordingly, equations 2 and 3 may be combined to yield:

$$V_k = V_{OC} - I_k R_0 - \exp\left(-\frac{\Delta t}{R_1 C_1}\right)(V_{OC} - I_{k-1}R_0 - V_{k-1}) - \quad (5)$$
$$\frac{1}{C_1}\int_{\xi=t_{k-1}}^{\xi=t_k} I(\xi)\exp\left(-\frac{t_k-\xi}{R_1 C_1}\right)d\xi$$

If $I(\xi)$ is approximated by a step current of $I_{k-1}$, equation 5 may be reduced to yield:

$$V_k = aV_{k-1} + (1-a)V_{OC} - I_k R_0 - I_{k-1}[(1-a)R_1 - aR_0] \quad (6)$$

where $$a = \exp\left(-\frac{\Delta t}{R_1 C_1}\right).$$

Additionally, if $I(\xi)$ is approximated by a step current of $(I_{k-1}+I_k)/2$, equation 5 may be reduced to yield:

$$V_k = aV_{k-1} + (1-a)V_{OC} - I_k\left[(1-a)\frac{R_1}{2} + R_0\right] - I_{k-1}\left[(1-a)\frac{R_1}{2} - aR_0\right] \quad (7)$$

Further, if $I(\xi)$ is approximated by a piece-wise linear equation of $(I_{k-1}+(I_k-I_{k-1}))/((t_k-t_{k-1})\times(\xi-t_{k-1}))$, equation 5 may be reduced to yield:

$$V_k = aV_{k-1} + (1-a)V_{OC} - \qquad (8)$$
$$I_k\left[\left(1 + \frac{1-a}{\ln a}\right)R_1 + R_0\right] - I_{k-1}\left[-\left(a + \frac{1-a}{\ln a}\right)R_1 - aR_0\right]$$

Due to the continuous nature of $I(\xi)$ for all time intervals, equation 8 may calculate the battery voltage with greater accuracy than equations 6 and 7, which are derived based on discontinuous step currents. For convenience, equation 8 may be rewritten as:

$$V_k = \theta_1 - I_k\theta_3 - I_{k-1}\theta_2 + \theta_4 V_{k-1} \text{ where} \qquad (9)$$

$$\theta_1 = (1 - \theta_4)V_{OC}; \qquad (10)$$

$$\theta_2 = -\left(\theta_4 + \frac{1-\theta_4}{\ln\theta_4}\right)R_1 - \theta_4 R_0; \qquad (11)$$

$$\theta_3 = \left(1 + \frac{1-\theta_4}{\ln\theta_4}\right)R_1 + R_0; \text{ and} \qquad (12)$$

$$\theta_4 = \exp\left(-\frac{\Delta t}{R_1 C_1}\right). \qquad (13)$$

In the present embodiment, equation 9 is used as a battery model to recursively estimate four parameters, $\theta_1$-$\theta_4$, simultaneously from the measured voltage and current data using a Kalman filter method. The physical parameters such as $V_{OC}$ (e.g., OCV 44), $R_0$ (e.g., resistance 46), $R_1$ (e.g., resistance 48), $C_1$ (e.g., capacitance 50), and a time constant $\tau = R_1 C_1$ are extracted from $\theta_1$-$\theta_4$ according to the following equations:

$$V_{OC} = \frac{\theta_1}{1-\theta_4}; \qquad (14)$$

$$R_1 = -\frac{\theta_3\theta_4 + \theta_2}{\frac{(1-\theta_4)^2}{\ln\theta_4}}; \qquad (15)$$

$$R_0 = \theta_3 + \frac{\theta_3\theta_4 + \theta_2}{\frac{(1-\theta_4)^2}{\ln\theta_4}}\left(1 + \frac{1-\theta_4}{\ln\theta_4}\right); \text{ and} \qquad (16)$$

$$\tau = R_1 C_1 = -\frac{\Delta t}{\ln\theta_4} \qquad (17)$$

A standard Kalman filter method may be implemented using a two-model process. To estimate the four parameters, $\theta_1$-$\theta_4$, using the standard Kalman filter method, the state transition model may be described by:

$$\Theta(k+1) = \Theta(k) + R(k) \qquad (18)$$

where $R(k)$ is a process noise vector and $\Theta(k)$ is a state vector with $\theta_1$-$\theta_4$ being the four parameters of the state vector. In contrast to equation 18 and other Kalman filter methods, an alternate Kalman filter method described below does not calculate state transitions explicitly. Instead, the state measurement mode may be described using the following equation:

$$V(k) = \Phi(k)'\Theta(k) + W(k) \qquad (19)$$

where $W(k)$ is a measurement noise and $\Phi(k)$ is a regression vector described the following equation:

$$\Phi(k) = [1 - I(k-1) - I(k) V(k-1)]' \qquad (20)$$

Further, using the alternate Kalman filter method, a Kalman gain $K(k)$ for SOC estimation is calculated using the following equation:

$$K(k) = \frac{P(k-1)\Phi(k)}{1 + \Phi(k)' P(k-1)\Phi(k)} \qquad (21)$$

Accordingly, the state transition model may be updated as follows:

$$\Theta(k) = \Theta(k-1) + K(k)[y - \Phi'\Theta(k-1)] \qquad (22)$$

where y is the measured battery voltage 52 at time step k. Further, a covariance matrix $P(k)$ is updated by the following equation:

$$P(k) = [I - K(k)\Phi(k)'] P(k-1) + R \qquad (23)$$

In the alternate Kalman filter method, $\theta_1$ is identified as a fast time-varying parameter, and $\theta_2$-$\theta_4$ are identified as slow time-varying parameters. To implement this feature with the alternate Kalman filter method, a process noise matrix R is defined with the following equation:

$$R = \begin{bmatrix} r & 0 & 0 & 0 \\ 0 & 0 & 0 & 0 \\ 0 & 0 & 0 & 0 \\ 0 & 0 & 0 & 0 \end{bmatrix} \qquad (24)$$

where r is a small value (e.g., r may be set to approximately 0.001) used to control the variability of $\theta_1$ with time using a random walk concept. This enables the Kalman filter to estimate the time-varying parameters of a rechargeable battery without using a state transition model, which is often related to calculating the SOC change by current integration or coulomb counting. Additionally, by establishing the three other values across the diagonal of the process noise matrix $R(k)$ at zero, the invariant or slow time-varying parameters, $\theta_2$-$\theta_4$, remain generally unchanged.

The computation of the covariance matrix $P(k)$ plays a role in improving numerical efficiency and accuracy of the estimated battery parameters. Due to truncation and rounding off errors in a computer, the alternate Kalman filter method may lead to a loss of symmetry and positive definiteness of $P(k)$, or possibly a divergence. Accordingly, in the alternate Kalman filter method, a U-D factorization method is implemented for calculating $P(k)$. The U-D factorization method improves the positive-definiteness and symmetry of $P(k)$, which may result in attainment of high estimation accuracy and robustness.

Implementing the Kalman filter function with the U-D factorization method may include calculating the following equation:

$$F = U'\Phi, G = DF, \alpha_0 = 1 \qquad (25)$$

Upon calculating equation 25, for the range of values from j=1 to j=M, the following equation is calculated:

$$\begin{cases} \alpha = \alpha_0 + F(j)G(j) \\ D(j,j) = D(j,j)\alpha_0/\alpha \\ b(j) = G(j) \\ c(j) = -F(j)/\alpha_0 \\ \alpha_0 = \alpha \end{cases} \qquad (26)$$

Additionally, for the range of values from j=1 to j=i−1, the following equation is calculated:

$$\begin{cases} temp = U(i, j) \\ U(i, j) = temp + b(i) \times c(j) \\ b(i) = b(i) + temp \times b(j) \end{cases} \quad (27)$$

Further, the value of r is added to D(1,1) with the following equation:

$$D(1,1) = D(1,1) + r \quad (28)$$

The gain is also calculated with the following equation:

$$K = b/\alpha \quad (29)$$

Upon completing the calculations for equations 25-29, new estimates are computed using the following equation:

$$\Theta = \Theta + K(y - \Phi'\Theta) \quad (30)$$

Figure 6A:
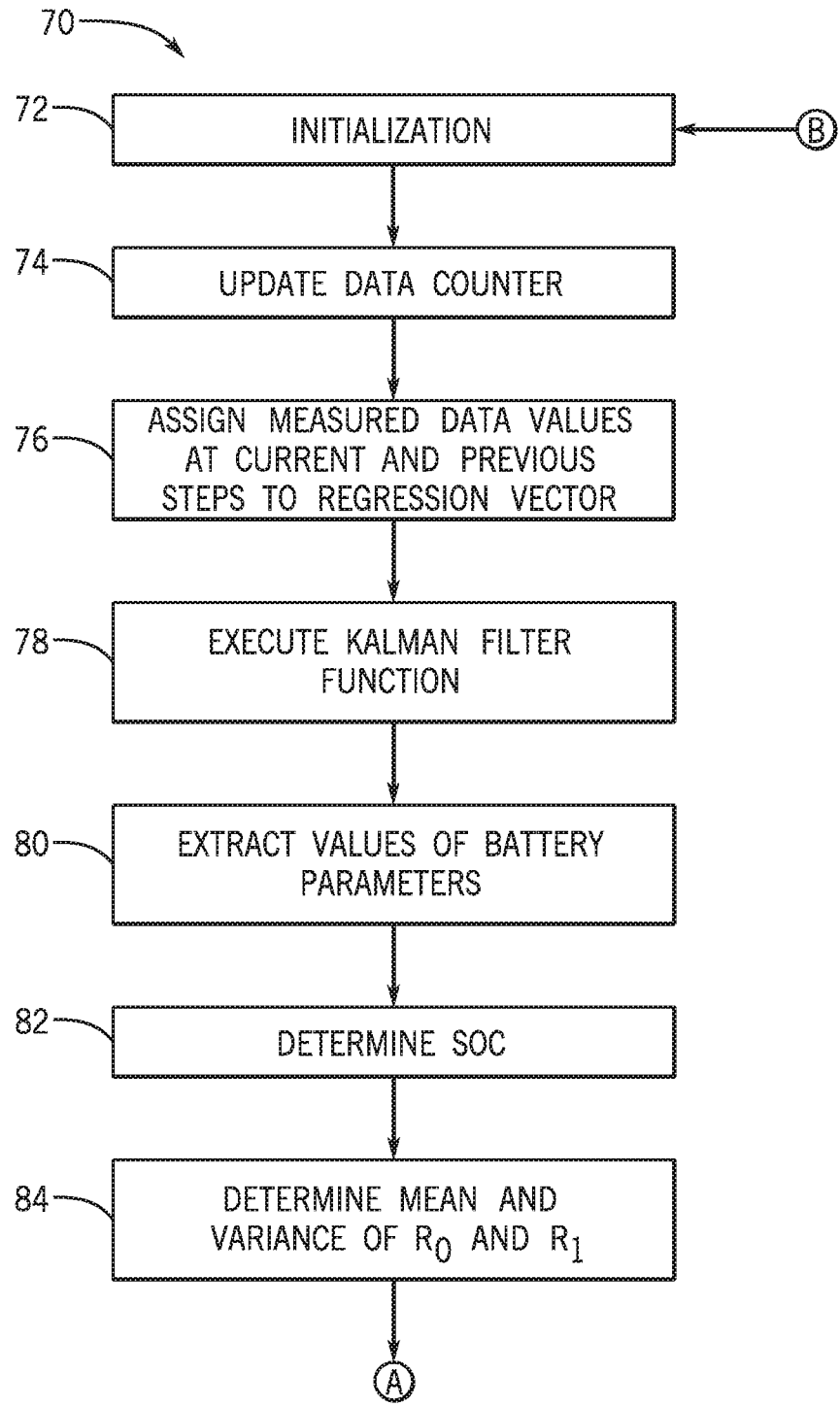
FIGS. 6A and 6B are a process flow diagram describing a method for calculating energy storage component parameters and determining parameter convergence of the energy storage component, in accordance with an embodiment of the present approach.
Figure 6B:
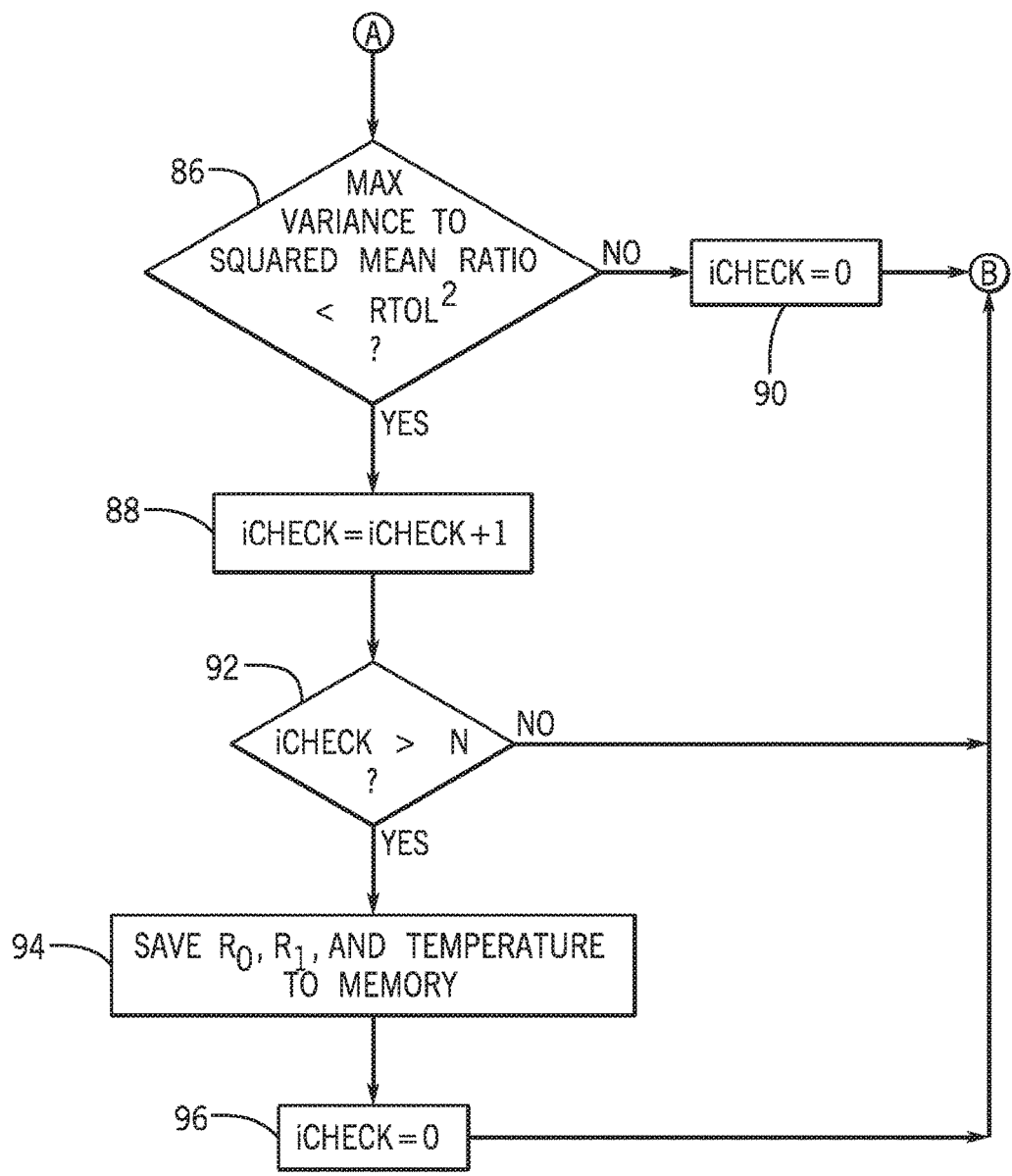

Turning now to FIGS. 6A and 6B, a flowchart of a method 70 illustrates a method for determining battery parameters of the energy storage component 14 using the alternate Kalman filter method described above. Initially, at block 72, initialization is performed by the control unit 32. During initialization, arbitrary initial values of the parameters $\theta_1$-$\theta_4$ may be assigned to the state vector $\Theta$. The initial values of the parameters may be arbitrary because the alternate Kalman filter method uses a starting point to determine the final values of the parameters, and the alternate Kalman filter method does not require a starting point that is close to actual values of the parameters $\theta_1$-$\theta_4$. Accordingly, the state vector $\Theta$ may be initialized to [0 0 0 0]' during initialization. Additionally, during initialization, U, may be initialized as a unit diagonal matrix (i.e., a matrix with values of 1 assigned to the diagonal elements), and D may be initialized as a diagonal matrix with a large value (e.g., 1000) assigned to each of the diagonal elements. This initialization may enable the method 70 to begin training a measurement model, represented by equation 9 above, when new voltage and current measurements of the energy storage component 14 from the sensors 38 become available to the control module 32. Further, the initialization may include setting values for relative error tolerance (RTOL) and a scaling factor. RTOL may represent a smoothness and flatness criteria, and the scaling factor may be a factor for the battery current to avoid an overflow math error that may be encountered on a fixed-point microprocessor.

Subsequently, as block 74, a data counter may be updated when new data becomes available at the control module 32 from the sensors 38. For example, the following equation may represent the data counter:

$$k = k + 1 \quad (31)$$

where k is the current data count. Further, at block 76, measured data values are assigned to the regression vector $\Phi(k)$ at the current and previous steps. The measured data values may include measured battery voltage and current values.

At block 78, the Kalman filter function is executed. The Kalman filter function may include the equations 25-30 described above. From the execution of the Kalman filter function, values of the battery parameters (e.g., OCV 44, resistances 46 and 48, capacitance 50, and time constant τ) may be extracted from values of $\theta_1$-$\theta_4$ at block 80. Additionally, at block 82, using the value of the OCV 44 extracted from values of $\theta_1$-$\theta_4$, the SOC of the energy storage component 14 may be determined based on an OCV to SOC look-up table stored in a memory 36 of the control module 32. The OCV to SOC look-up table may generally be based on a curve similar to the curve 60 depicted in FIG. 5.

Blocks 84-96 relate to monitoring a convergence of the estimated values of the resistances 46 and 48. By monitoring the convergence of the resistances 46 and 48, the control module 32 may confirm that the estimated values of the resistances 46 and 48 are time invariant. Accordingly, at block 84, a mean and a variance of a moving sample window of a sample size L of the resistances 46 and 48 are recursively determined. Specifically, the following equations may be used to determine the means and the variances of the resistances 46 and 48:

if $k \leq L$, then (32)

$$\begin{cases} \mu_k = \frac{k-1}{k}\mu_{k-1} + \frac{1}{k}R_j(k) \\ \sigma_k^2 = \frac{k-2}{k-1}\sigma_{k-1}^2 + \frac{k}{(k-1)^2}[R_j(k) - \mu_k]^2 \\ X_j(k) = R_j(k), j = 0, 1 \end{cases}$$

else $$\begin{cases} i = \mathrm{mod}(k, L) \\ \mu_k = \mu_{k-1} + \frac{1}{N}[R_j(k) - X_j(i)] \\ \sigma_k^2 = \sigma_k^2 + \frac{R_j(k)^2 - X_j(i)^2}{N-1} - \frac{R_j(k) - X_j(i)}{N-1}\left(2\mu_k - \frac{R_j(k) - X_j(i)}{N}\right) \\ X_j(k) = R_j(k), j = 0, 1 \end{cases} \quad (33)$$

where $\mu_k$ and $\sigma_k^2$ are the sample mean and variance of resistance $R_j$ evaluated at time step k. As seen in equations 32 and 33, the recursive formula developed to calculate the sample mean and variance does not involve data copying at each time, and only the new data and the oldest data are involved in the mean and variance calculations. Thus, the control module 32 calculates equations 32 and 33 efficiently.

Subsequently, at block 86, the control module 32 calculates ratios of the variance and a squared mean for each of the resistances 46 and 48, and the control module 32 determines which of the two resistances 46 and 48 has a greater ratio. Further, upon determining which ratio is greater, the control module 32 compares the greater ratio to a square of the relative error tolerance (RTOL). This comparison functions as a smoothness and flatness test. The smoothness and flatness test may be used to determine whether the estimated parameters no longer change with time after a learning time period of the system. Accordingly, to judge a convergence of the resistances 46 and 48, the smoothness and flatness test is passed N times consecutively. The value of N may be 5 cycles, 10 cycles, 15 cycles, or any other number of cycles that would reliably indicate convergence of the resistances 46 and 48. Further, each cycle of the smoothness and flatness test of block 86 may run for a total time period of 0.1 nanoseconds if a sample frequency of 1 second is used for the method 70.

Subsequently, at block 88, a cycle counter (e.g., iCheck) is updated by adding 1 to the previous cycle counter value if the greater ratio is less than the square of the RTOL. Conversely, if the greater ratio is greater than the square of the RTOL, at block 90, the cycle counter is reset to zero, and the method 70 returns to initialization at block 72. If the cycle counter is updated at block 88 (i.e., the greater ratio is less than the square of the RTOL), a determination, at block 92, is made to determine whether the cycle counter has exceeded the value of N. If the cycle counter has not exceeded the value of N, then the method 70 returns to initialization at block 72.

However, if the cycle counter has exceeded the value of N, then mean values of the converged resistances 46 and 48 and the temperature value are stored to the memory 36 of the control module 32 at block 94. Through measuring values of the resistances 46 and 48 as functions of the temperature, how the resistances 46 and 48 degrade over time may be observed by the control module 32. Measuring degradation of the resistances 46 and 48 may enable characterization of a state of health (SOH) of the energy storage component 14 from a perspective of ohmic resistance growth of the energy storage component 14. Once the mean values of the converged resistances 46 and 48 and the temperature value are stored, the cycle counter is reset to zero, at block 96, and the method 70 returns to the initialization at block 72. The method 70 may be repeated until the control module 32 provides an indication to stop the operation.

Figure 7A:
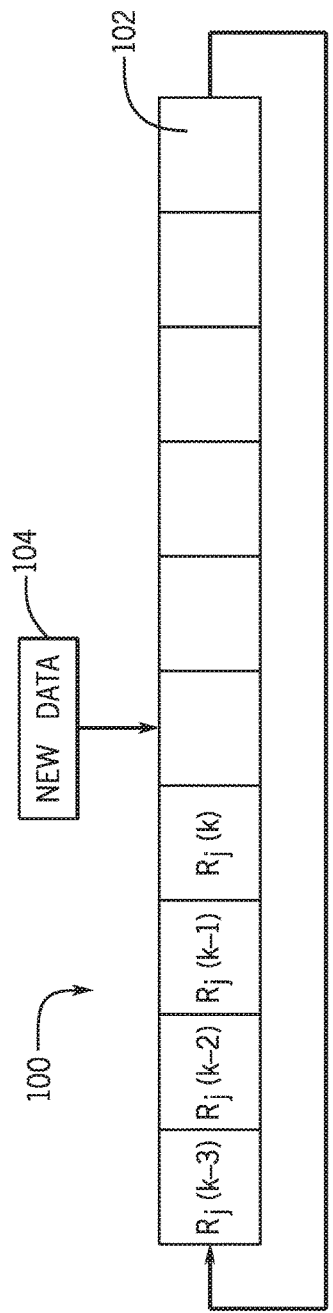
FIGS. 7A and 7B are ring buffers for storing data calculated using the process flow diagram of FIGS. 6A and 6B, in accordance with an embodiment of the present approach.
Figure 7B:
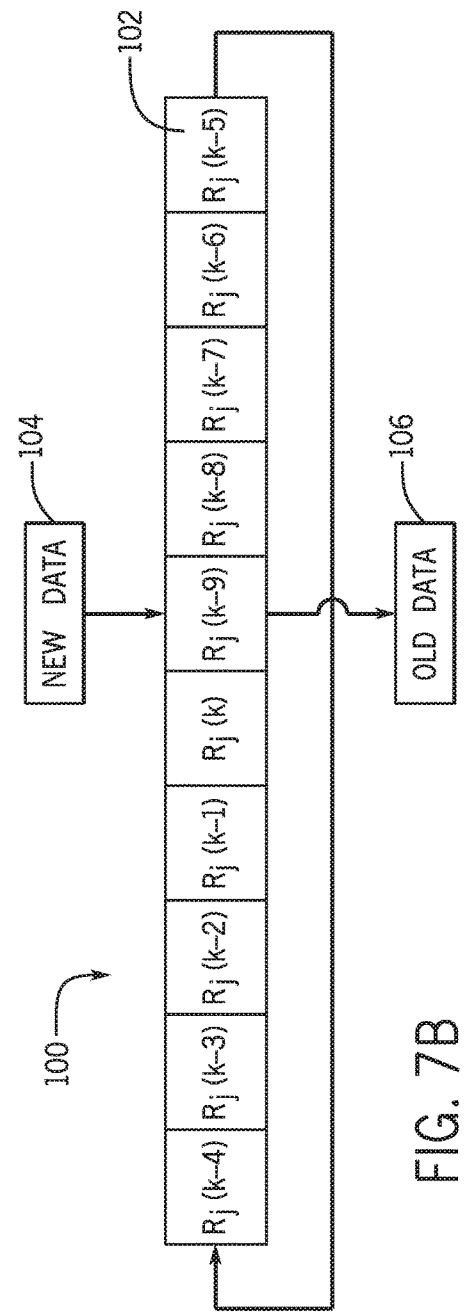

Turning now to FIGS. 7A and 7B, a recursive calculation of sample means and variances of the resistances 46 and 48 of a sample size L (e.g., as implemented at block 84 of FIG. 6A) may be stored in a ring buffer 100 with L storage positions 102. For example, for a sample size L of 10, the ring buffer 100 may include 10 of the storage positions 102, as depicted. As new data 104, which includes the sample mean and variance of the resistances 46 and 48, is calculated, the new data 104 may be stored in one of the storage positions 102. As depicted in FIG. 7A, empty storage positions 102 are populated with the new data 104 in chronological order of when each sample was recorded. Alternatively, as depicted in FIG. 7B, the new data 104 is stored in the storage position 102 of the oldest data value in the ring buffer 100 (e.g., $R_j(k-9)$) in such a manner that the new data 104 is stored within the ring buffer 100 and old data 106 (e.g., $R_j(k-9)$) is removed from the ring buffer 100. Accordingly, only L storage positions 102 are available to store sample means and variances of a sample size L, and the old data 106 is removed from the ring buffer 100.

There may also be a benefit in estimating a capacity of the energy storage component 14 in real-time. The capacity of the energy storage component 14 may be referred to as a state of health (SOH) of the energy storage component 14. The SOH of the energy storage component 14 may be indicative of a change in a rated capacity of the energy storage component 14. Discussed in detail below are two complementary methods for estimating the capacity of the energy storage component 14. A first method, discussed in relation to FIG. 8, provides a linear regression of real-time battery current and voltage using a Kalman filter and an equivalent circuit battery model. A second method, discussed in relation to FIG. 9, involves monitoring two open circuit voltage relaxation events, and calculating the SOH from the two open circuit voltage relaxation events. Each of the two methods may be executed by the control module 32 to estimate the capacity of the energy storage component.

Figure 8A:
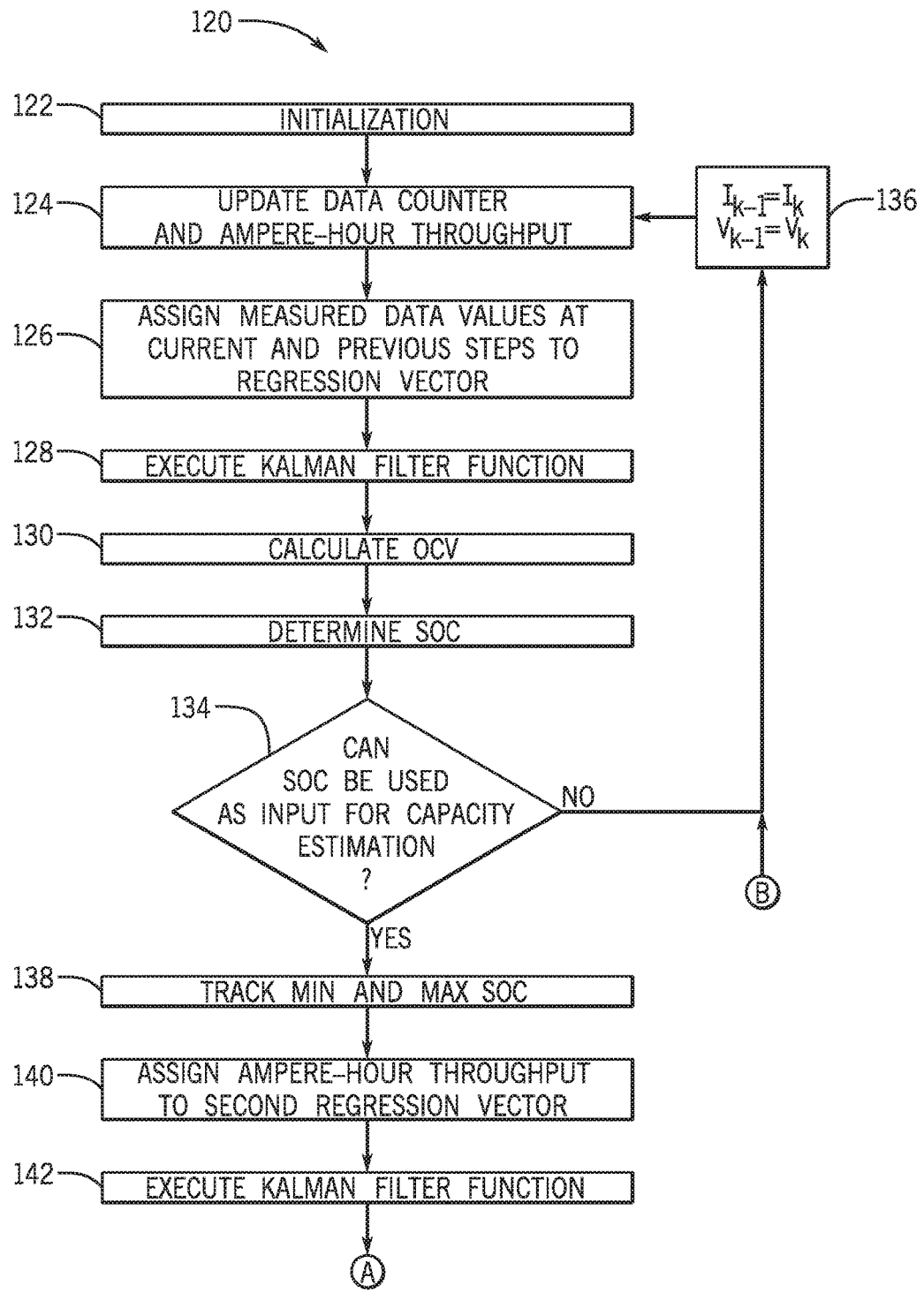
FIGS. 8A and 8B are a process flow diagram describing a method for calculating a capacity of the energy storage component using two linear regression models, in accordance with an embodiment of the present approach.
Figure 8B:
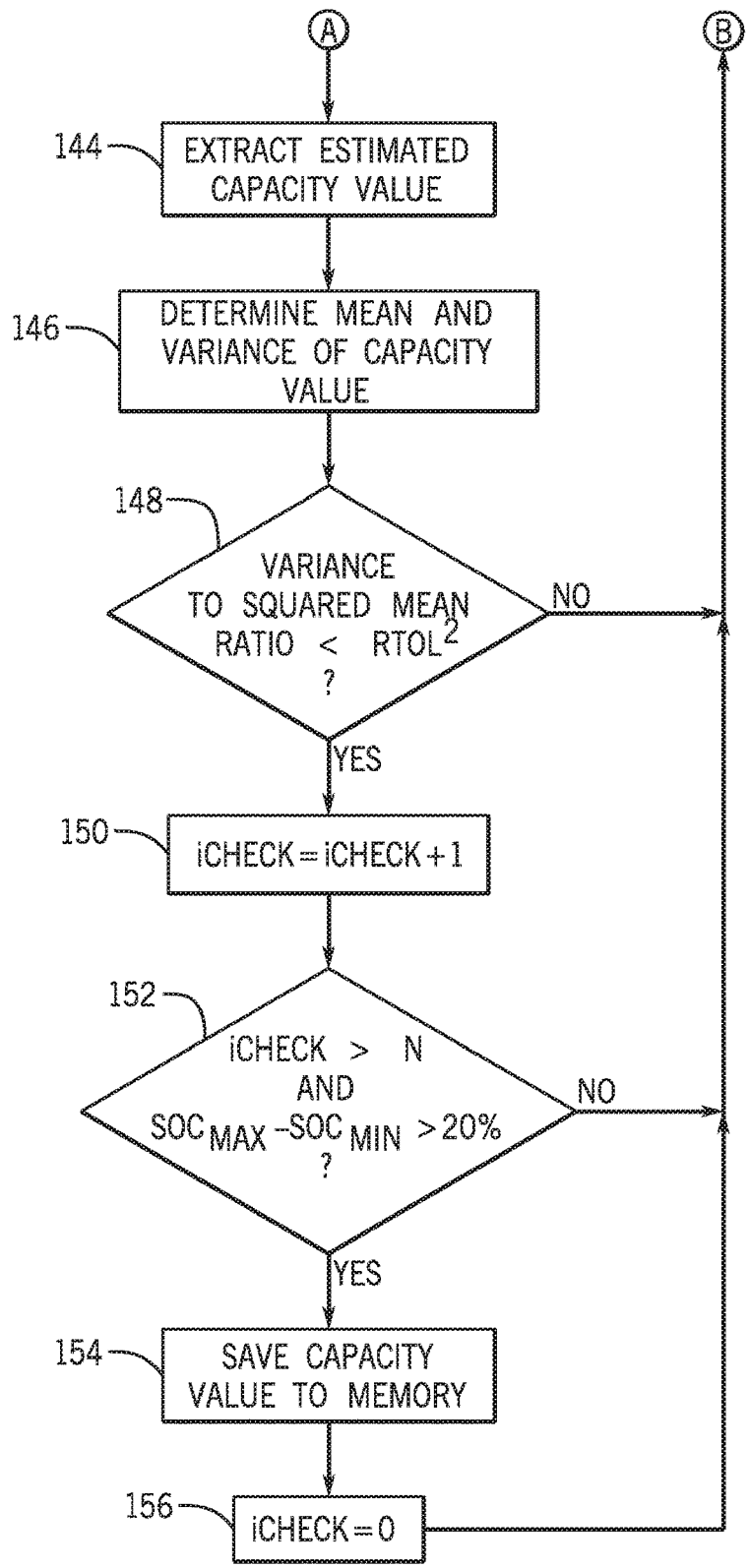

Turning now to FIGS. 8A and 8B, a method 120 for calculating the SOH of the energy storage component 14 is depicted. The method 120 is based on two linear regression models running in series at each time step. Because the method 120 relies on linear regression models, the method 120 may provide numerical stability for estimating the SOH, as parameters of the linear regression models will converge even when initial values of the parameters are arbitrarily selected. Arbitrary selection of the initial values of the parameters may provide a distinct advantage over extended Kalman filter (EKF) models, which generally rely on accurate initial guesses of parameters of rechargeable batteries due to nonlinearity of the EKF models. Additionally, the method 120 may provide a greater level of tolerance of measurement noises and data imperfection than the EKF models.

A partial discharge of the energy storage component 14 may be used to determine the SOH (i.e., the capacity) of the energy storage component 14 using the following equation:

$$Q = \frac{100 \times \int_0^t I dt}{SOC - SOC_0} \quad (34)$$

where Q is a capacity of the energy storage component 14 in ampere-hours (Ah), I is the current in amperes, SOC is a current SOC value, and $SOC_0$ is an initial SOC value. As discussed above, the SOC may be obtained from a look-up table similar to the curve 60 of FIG. 5 when an estimated or known value of the open circuit voltage is available. Equation 34 may also be rewritten as the following equation:

$$SOC = SOC_0 + w\int_0^t I dt \quad (35)$$

where w is equal to 100/Q and $\int_0^t I dt$ is an accumulative Ah throughput of the energy storage component 14. Equation 35 may be used as a governing equation for battery capacity estimation in the method 120. $SOC_0$ and w are each time-invariant parameters, which can be estimated if the SOC values are known. As discussed above in the discussion of FIGS. 6A and 6B, the SOC value may be estimated using a Kalman filter technique. Accordingly, in the method 120, two linear regression models are used. That is, blocks 122 through 132 may determine an SOC value for the energy storage component 14, and blocks 134-156 may provide an estimation of $SOC_0$ and w using the SOC and Ah throughputs as inputs along with a convergence determination. Accordingly, the battery capacity may be readily calculated from the estimated value of w.

At block 122, the method 120 is initialized. During initialization, arbitrary initial values can be assigned to $\theta_1$-$\theta_4$ for the state vector $\Theta$. The initial values of the parameters may be arbitrary because the alternate Kalman filter method uses a starting point to determine the final values of the parameters, but the alternate Kalman filter method does not rely on a starting point that is close to actual values of the parameters $\theta_1$-$\theta_4$. Accordingly, the state vector $\Theta$ may be initialized to [0 0 0 0]' during an initialization event. Additionally, during initialization, U, may be initialized as a unit diagonal matrix (i.e., a matrix with values of 1 assigned to the diagonal elements), and D may be initialized as a diagonal matrix with a large value (e.g., 1000) assigned to each of the diagonal elements. This initialization may enable the method 70 to begin training a measurement model, represented by equation 9 above, when new voltage and current measurements of the energy storage component 14 from the sensors 38 become available to the control module 32. Further, the initialization may include setting values for relative error tolerance (RTOL) and a scaling factor. RTOL may represent a smoothness and flatness criteria, and the scaling factor may be a factor for the battery current to avoid an overflow math error that may be encountered on a fixed-point microprocessor. Initialization at block 122 may be performed on both the linear regression model for the SOC estimation and the linear regression model for the $SOC_0$ and w.

At block 124, a data counter may be updated when new data becomes available at the control module 32 from the sensors 38. For example, equation 31 may be used as a representation of the current data count. Additionally, an ampere-hour throughput may also be updated when data becomes available using the following equation:

$$q=q+\Delta q_k \quad (36)$$

where q is the ampere-hour throughput. Further, at block 126, measured data values are assigned to the regression vector Φ(k) at the current and previous steps. The measured data values may include measured battery voltage and current values.

At block 128, the Kalman filter function is executed. The Kalman filter function may include the equations 25-30 described above. From the execution of the Kalman filter function, values of the OCV 44, in addition to the resistances 46 and 48, capacitance 50, and time constant τ, may be extracted from values of $\theta_1$-$\theta_4$ at block 130. Additionally, at block 132, using the value of the OCV 44 extracted from values of $\theta_1$-$\theta_4$, the SOC of the energy storage component 14 may be determined based on an OCV to SOC look-up table stored in a memory 36 of the control module 32. The OCV to SOC look-up table may generally be based on a curve similar to the curve 60 depicted in FIG. 5.

Subsequently, at block 134, the control module 32 makes a determination of whether the estimated SOC is usable as an input to proceed with the subsequent capacity estimation of the energy storage component 14. For example, the control module 32 may make the determination based on whether a battery terminal temperature requirement has been met (e.g., the temperature of a terminal of the energy storage component is less than approximately 25 degrees Celsius) and whether a minimum SOC learning time period has been exceeded (e.g., the time period between the current measurement and the initial condition is greater than 100 seconds). If either of these conditions are not met, at block 136, the current and voltage measurements are reset to the previous values, and the method 120 restarts at the data counter update of block 124.

If the SOC is available for use in the capacity estimation, at block 138, minimum and maximum SOC values are tracked for use in calculating the maximum SOC swing. Further, the ampere-hour throughput is assigned to a second regression vector at block 140. The second regression vector is represented by Φ1 and represents the following equation:

$$\Phi 1(k)=[1 q/\text{scale } 1]' \quad (37)$$

where q is the ampere hour throughput and scale 1 is a scaling factor for the estimated capacity to avoid an overflow math error when calculated on a fixed-point microprocessor.

Upon assigning the ampere-hour throughput to the second regression vector, the Kalman filter function is executed at block 142. Executing the Kalman filter function may update the covariance matrix U1 and D1 and the parameter vector Θ1 for the capacity estimation, which was initialized as [0 0 0 0]' along with the parameter vector Θ for the SOC estimation. Further, the Kalman gain K(k) for the capacity estimation is represented by the following equation:

$$K1(k) = \frac{P1(k-1)\Phi 1(k)}{1+\Phi 1(k)'P1(k-1)\Phi 1(k)} \quad (38)$$

And the covariance matrix P1(k) is updated by the following equation:

$$P1(k)=[I-K1(k)\Phi 1(k)']P1(k-1) \quad (39).$$

When compared to equation 23 of the SOC estimation, equation 39 does not include the process noise matrix R because both $SOC_0$ and w are time-invariant parameters.

Subsequently, at block 144, an estimated capacity value Q may be extracted from the parameter vector Θ1. For example, the estimated capacity value Q may be represented by the following equation:

$$Q=-100/\theta 1_2 \quad (40)$$

where $\theta 1_2$ is the second parameter from the parameter vector Θ1. After extracting the estimated capacity value Q, blocks 146-156 may be used to monitor convergence of the capacity estimation.

Accordingly, at block 146, a mean and a variance of a moving sample window of a sample size L of the estimated capacity value Q is recursively determined and stored in a ring buffer similar to the ring buffer 100 discussed above. After the mean and variance are determined, at block 148, the variance to mean squared ratio is compared to the square of the RTOL. This comparison functions as a smoothness and flatness test. The smoothness and flatness test may be used to determine whether the estimated parameters (e.g., the estimated capacity value Q) no longer change with time after a learning time period of the system. Accordingly, to judge a convergence of the estimated capacity value Q, the smoothness and flatness test is passed N times consecutively. The value of N may be 5 cycles, 10 cycles, 15 cycles, or any other number of cycles that would reliably indicate convergence of the estimated capacity value Q. Further, each cycle of the smoothness and flatness test of block 148 may run for a total time period of 0.1 nanoseconds if a sample frequency of 1 second is used for the method 120.

Subsequently, at block 150, a cycle counter (e.g., iCheck) is updated by adding 1 to the previous cycle counter value if the ratio is less than the square of the RTOL. Conversely, if the ratio is greater than the square of the RTOL, at block 136, the current and voltage measurements are reset to the previous values, and the method 120 restarts at the data counter update of block 124. If the cycle counter is updated at block 150 (i.e., the greater ratio is less than the square of the RTOL), a determination, at block 152, is made to determine whether the cycle counter has exceeded the value of N and whether the SOC swing (maximum SOC minus the minimum SOC) is greater than 20% of $SOC_0$. A threshold used at block 152 for the SOC swing may also be another percentage of $SOC_0$ depending on the specific energy storage component 14. For example, the percentage could be 25% or up to 50%, or the percentage could be 10% or 15% of $SOC_0$. If the cycle counter has not exceeded the value of N and/or the SOC swing is not large enough, then the method 120 returns to block 136 to reset voltage and current values.

If the cycle counter has exceeded the value of N and the SOC swing is sufficient, at block 154, the extracted estimated capacity value Q is saved to the memory 36. After the estimated capacity value Q is saved to the memory 36, the cycle counter is reset to zero, and the method 120 returns to block 136. Additionally, the method 120 may repeat as described above until the control module 32 receives an indication to stop estimating the estimated capacity value Q of the energy storage component 14.

Figure 9A:
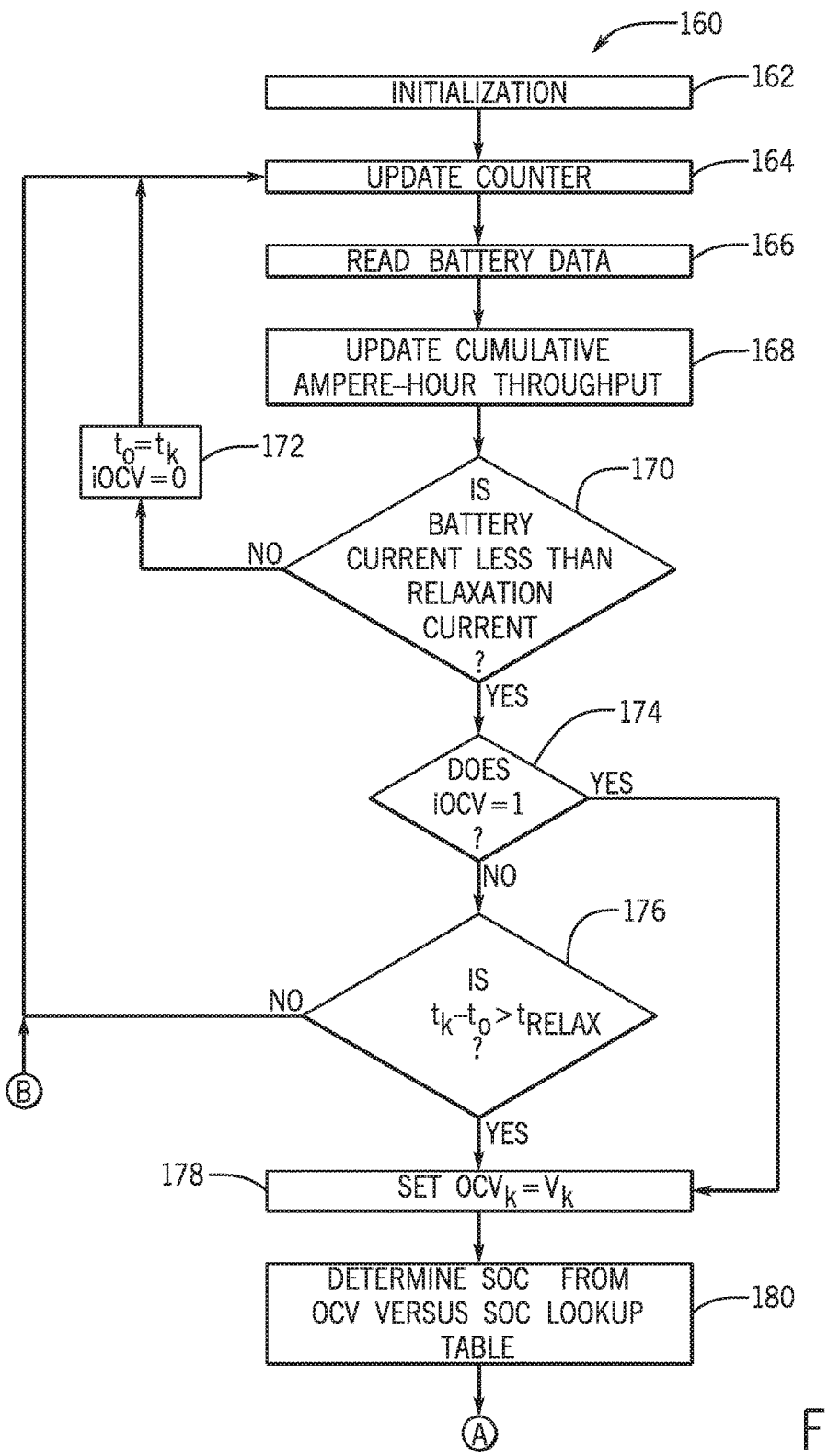
FIGS. 9A and 9B are a process flow diagram describing a method for calculating a capacity of the energy storage component using two relaxation open circuit voltage measurements and coulomb counting, in accordance with an embodiment of the present approach.
Figure 9B:
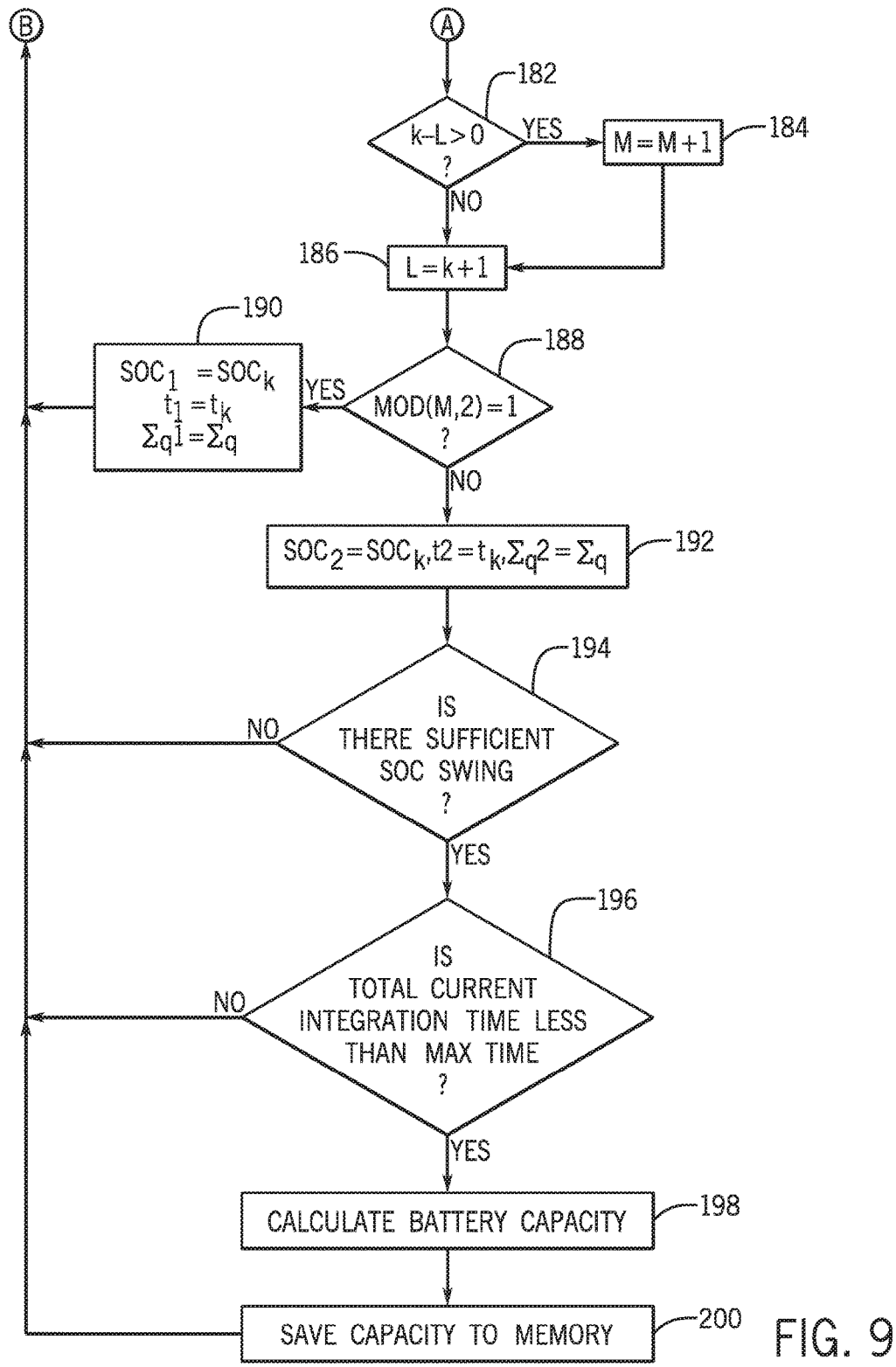

FIGS. 9A and 9B depict a method 160 for calculating the SOH of the energy storage component 14 by monitoring two valid open circuit voltage (OCV) relaxation events and integrating current over time between the two valid OCV relaxation events. A first of the two valid OCV relaxation events may be measured immediately upon starting the vehicle 10 after an extended rest period (e.g., after the vehicle has been turned off for greater than 2 hours), and a second of the two valid OCV relaxation events may be measured when the energy storage component 14 has been relaxed for an extended period (e.g., after the vehicle 10 is turned off and a predetermined amount of time has passed). Additionally, a time between the two valid OCV relaxation events may be limited to limit an accumulation of current offset error and improve accuracy of the SOH measurement.

At block 162, the method 160 is initialized. During initialization, time counters $t_1$ and $t_2$, starting ampere-hour throughput $\Sigma q$, and a binary OCV validity status iOCV are set. If the OCV of the energy storage component 14 is fully relaxed at the moment the control module 32 wakes up (e.g., when the vehicle 10 is cranked), a value of iOCV may be set to 1 during initialization. Otherwise, the value of iOCV may be set to 0 during initialization. The OCV may be fully relaxed after parking a vehicle for an extended period of time (e.g., greater than one hour) at room temperature with a negligible current drain value of less than a relaxation current threshold $I_{Relax}$. One way to confirm whether the OCV is fully relaxed is to monitor the rate of OCV change over time, as the OCV may change asymptotically with time. After an extended period of time at room temperature, the OCV may change very slowly with time, and such an OCV may be used to represent the relaxed OCV with a sufficient accuracy for the method 160.

After initialization, the counter is updated, at block 164, when new data becomes available at the control module 32 from the sensors 38. For example, equation 31 may be used as a representation of the current data count. Upon updating the counter, at block 166, data is read from the sensors 38 of the energy storage component 14. The data may include battery current, voltage, and a step change in ampere-hour throughput. Accordingly, with the step change in ampere-hour throughput, at block 168, an accumulative ampere-hour throughput is updated using the following equation:

$$\Sigma q = \Sigma q + \Delta q_k \quad (41)$$

where $\Sigma q$ represents the accumulative ampere-hour throughput, and $\Delta q_k$ represents the step change in ampere-hour throughput.

At block 170, a determination is made by the control module 32 as to whether the battery current meets the predetermined relaxation current threshold $I_{Relax}$. The determination may be accomplished by measuring an absolute value of the battery current at the current step, and comparing the absolute value to $I_{Relax}$. If the absolute value of the battery current is greater than $I_{Relax}$, then the battery is not sufficiently relaxed. At this juncture, the time step may be monitored, and the iOCV value may remain at 0 or be set to 0 at block 172. Accordingly, the method 160 may start again at the counter update of block 164.

Alternatively, if the absolute value of the battery current is less than $I_{Relax}$, then a determination of the iOCV validity status may be determined at block 174. That is, if the value of iOCV is 1, then the energy storage component 14 has been in a relaxed state for a sufficient amount of time, and the OCV may be set to the current voltage reading $V_k$, at block 178. Alternatively, if the iOCV is 0, then, at block 176, a determination as to whether a sufficient amount of time has passed for the energy storage component 14 to be sufficiently relaxed is made. For example, an amount of time from initialization to the current step may be compared to a relaxation threshold time $t_{Relax}$. As mentioned above, $t_{Relax}$ may be set to 1 hour, 2 hours, or more hours under standard operating conditions. However, $t_{Relax}$ may increase or decrease based on external conditions, such as the battery temperature. In general, the greater the temperature of the battery, the shorter the $t_{Relax}$ time may be. If the relaxation threshold time $t_{Relax}$ has not been met, then the method 160 returns to the counter update at block 164 to begin the method 160 again.

Alternatively, if the relaxation threshold time $t_{Relax}$ has been met, then the energy storage component 14 has been in a relaxed state for a sufficient amount of time, and the OCV may be set to the current voltage reading $V_k$, at block 178. From the OCV value determined from the current voltage reading $V_k$, the current SOC may be determined from an OCV versus SOC lookup table similar to the curve 60 of FIG. 5.

Subsequently, at block 182, a determination is made as to whether the counter value k is greater than the sample size L. If the counter value k is greater than L, a value of a modulus variable M is updated by adding one to the value at block 184. The modulus variable M represents a cumulative number of times the OCV criteria has been met. Alternatively, if the counter value k is not greater than the sample size L, then the value of L is set to the counter value k plus 1 at block 186. After updating the values of the modulus variable M and/or the sample size L, a modulus operation is performed, at block 188, to alternate recording the current SOC value between two memory storage locations within the memory 36 of the control module 32. Accordingly, the method 160 will alternate storing the current SOC value at $SOC_1$, at block 190, and $SOC_2$ at block 192. Additionally, the time and accumulative ampere-hour throughput may also be stored in memory at blocks 190 and 192.

At block 194, a determination is made as to whether there is a sufficient SOC swing between the value stored for $SOC_1$ and the value stored for $SOC_2$. The sufficient SOC swing may be described as $SOC_{MIN}$, and $SOC_{MIN}$ may represent a threshold percentage difference between the two stored SOC values. For example, $SOC_{MIN}$ may be a 5% swing, a 10% swing, a 15% swing, or another percentage swing that establishes a sufficient difference between the two SOC values for an accurate capacity estimation of the energy storage component 14. If the SOC swing is not sufficient, the method 160 may return to the counter update at block 164.

If the SOC swing is sufficient, a determination may be made by the control module 32 as to whether a total current integration time is less than a maximum allowable time, at block 196. For example, if the total current integration time is greater than the maximum allowable time, a current offset error may impact the capacity estimation in an undesirable manner. Accordingly, it may be desirable to limit the total current integration time to less than approximately 50 hours. If the maximum allowable time has been exceeded, the method 160 may return to the counter update at block 164.

Alternatively, if the maximum allowable time has not been exceeded, the estimated battery capacity Q of the energy storage component 14 may be calculated at block 198. To calculate the estimated battery capacity Q, the following equation may be used:

$$Q = \frac{\Sigma q^2 - \Sigma q^1}{SOC2 - SOC1} \times 100 \quad (42)$$

where the values used for the calculation are obtained from the values stored at blocks 190 and 192. Subsequently, the estimated battery capacity Q is stored to the memory 36 at block 200. Further, upon storing the estimated battery capacity Q, the method 160 may return to the counter update of block 164, and the method 160 may operate recursively until an indication is provided to the control module 32 to stop the method 160.

The two capacity estimation methods 120 and 160 described above are complimentary to each other in practice. The method 120 may not use SOC swing between two OCV relaxation events, but may use real-time SOC swing while the vehicle 10 is in operation. Accordingly, the method 120 may be particularly applicable to advance start-stop and hybrid electric vehicles due to a design principle of the advance start-stop and hybrid electric vehicles to maximize charge rate to harvest energy when there is a surplus supply of kinetic energy and to maximize a discharge rate to improve fuel economy when there is a peak power consumption demand. Accordingly, the energy storage component 14 may establish a standby (rest) mode at an SOC of around 50%. Therefore, the energy storage component 14 would generally have a small separation between two OCV measurements. Alternatively, due to its simplicity, accuracy, and low implementation cost, the method 160 may be applicable when the vehicle 10 experiences several rest periods during typical operation to enhance the robustness and accuracy of the capacity estimations of the energy storage component 14.

Figure 10:
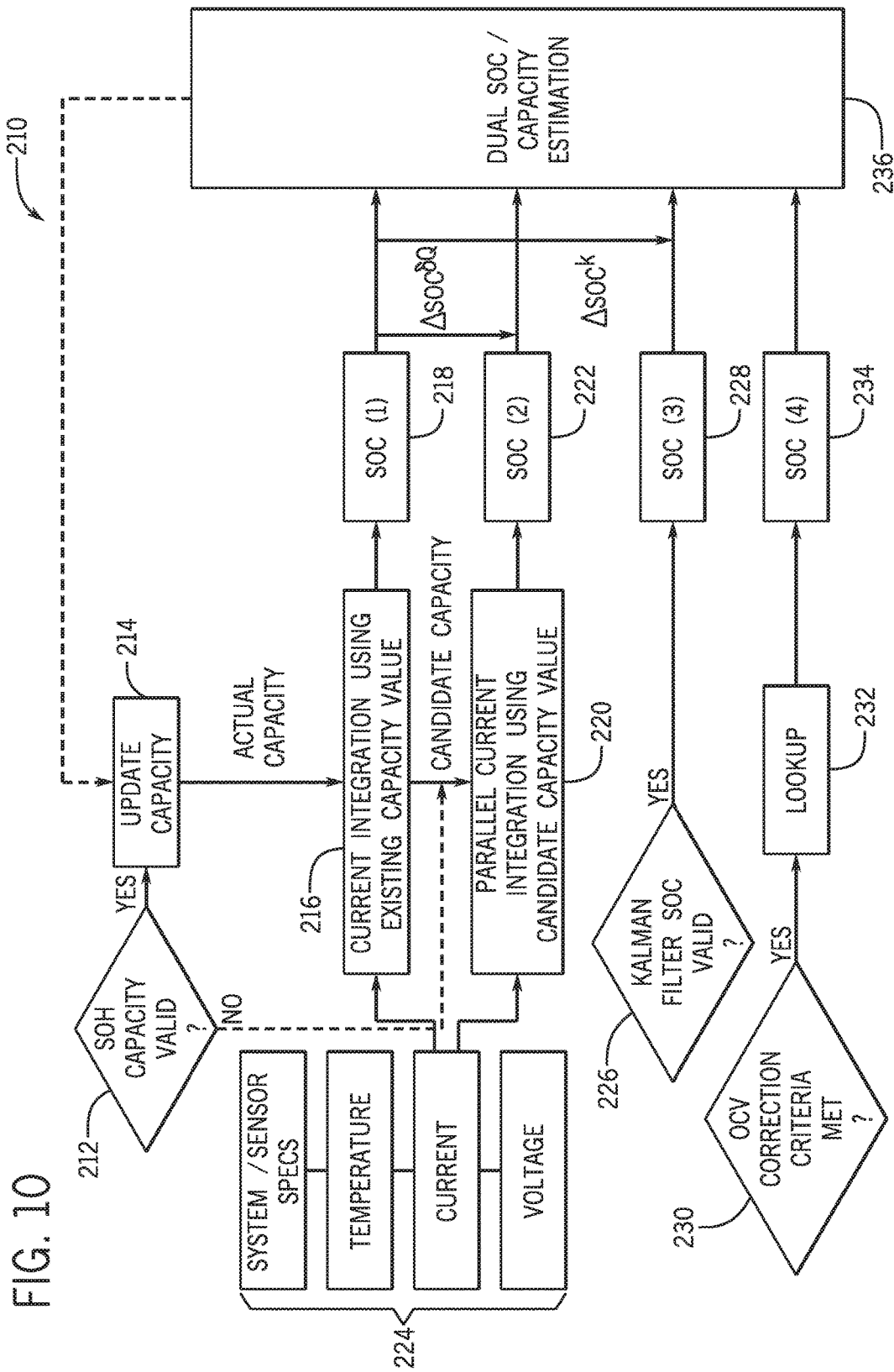
FIG. 10 is a process flow diagram describing a method for directionally validating a capacity estimation of the energy storage component, in accordance with an embodiment.

It may be beneficial to occasionally verify capacity estimation results of the energy storage component 14. Accordingly, FIG. 10 is a flowchart 210 describing a verification process of the estimated battery capacity Q of the energy storage component 14. At block 212, a determination is made by the control module 32 as to whether the capacity estimation for the energy storage component 14 is valid. For example, the capacity estimation may be invalid if there have not been any valid capacity estimation results from the methods 120 and 160 for an extended amount of time (e.g., greater than two months since the last valid capacity estimation results), if a recently calculated capacity estimation exceeds a threshold of change (e.g., the recently calculated capacity estimation is greater than 5 percent, greater than 10 percent, greater than 15 percent, or more different from the previously calculated capacity estimation), or if accuracy of a valid capacity estimation is not within an acceptable range. When any of these criteria are met, the control module 32 may initialize the verification process of the flowchart 210.

In determining if the accuracy of a valid capacity estimation is not within an acceptable range, an error of the capacity estimation may be calculated using an error of the SOC/OCV measurements as well as via current integration assuming current measurement accuracy. For example, Kalman filter methods may include an error estimation or maximum accuracy estimation (e.g., approximately 3%), and evaluation of the convergence criteria, as described herein, may refine this error estimation. After refining the error estimation, a time or energy throughput dependent error increase based on the expected aging under observed conditions of the battery system 12 may be applied to the error estimation. Accordingly, if a capacity estimation is determined within a certain accuracy, the error steadily increases until an opportunity for a new estimation with a lower error is reached, which will reset the error estimation.

If the capacity estimation is determined to be valid, then the current capacity estimation may be updated at block 214. The capacity updated at block 214 may be used, at block 216, as an actual capacity of the energy storage component 14 during a current integration process using the current capacity estimation (e.g., using equation 35, above). The result of the current integration process with the actual capacity of the energy storage component is a value of SOC(1) over an integration time period that is calculated at block 218.

Alternatively, if the capacity estimation is determined to not be valid (e.g., a mean error is too high, and a reset would not improve accuracy), then a candidate capacity may used, at block 220, in a current integration process that is parallel to the current integration process of block 216. The candidate capacity may be 5 percent less than the actual capacity used in the current integration process of block 216. The result of the current integration process using the candidate capacity is a value of SOC(2) over the integration time period that is calculated at block 222. Additionally, in performing the current integration processes at blocks 216 and 220, measured parameters 224 of the energy storage component 14 may be used. The measured parameters 224 may include system/sensor specifications, temperature, current, and voltage of the energy storage component 14.

To effectively use the verification process of the flowchart 210, an accurate initial SOC at the start of a parallel current integration process may be used. Therefore, the measured parameters 224 may provide values for the battery control module 32 to calculate the accurate initial SOC. For example, if the vehicle 10 exits an extended rest period of the energy storage component 14 prior to the parallel current integration processes at blocks 216 and 220, the open circuit voltage 44 of the energy storage component 14 may be measured from the measured parameters 224, as discussed in detail above. Using the open circuit voltage 44, an open circuit voltage to state of charge look-up table stored in the memory 36 may be consulted by the control module 32 to calculate an accurate initial SOC value. It may also be appreciated that a significant SOC delta (e.g., an SOC swing) between an initial SOC at a start of the parallel current integration process and a final SOC at a point in time where a changing capacity estimation value is assessed may be beneficial for accurate assessment of the validity of the capacity estimation value. This value may be represented by $\Delta SOC^{\delta Q}$.

Additionally, to compare to the SOC values resulting from the parallel current integration processes, a Kalman filter at block 226 may be used at the point in time where the changing capacity estimation value is assessed. For example, using the method 70 discussed above relating to FIGS. 6A and 6B, an SOC estimation (SOC(3)) of the energy storage component 14 may be calculated by the control module 32 at block 228. Alternatively, or in addition, if the energy storage component 14 is in a rest state, the OCV 44 may be obtained from the energy storage component 14 at block 230. Consultation by the control module 32, at block 232, of an OCV to SOC look-up table results in a calculation of the SOC(4) at block 234.

After SOC(1)-SOC(3) and/or SOC(4) are calculated, a directional comparison of the SOC values may be performed by the control module 32 at block 236. For example, the values of SOC(3) and SOC(4) at the point in time where the changing capacity estimation value is assessed may be compared to the values of SOC(1) and SOC(2) at the same point in time. This comparison may provide a number of details about the new capacity estimation of the energy storage component 14. If the values of SOC(3) and/or SOC(4) fall within the values of SOC(1) and SOC(2) or the values of SOC(3) and/or SOC(4) are in the same direction from SOC(1) as the value of SOC(2), then the control module 32 may deem an estimated capacity calculated from SOC(3) and/or SOC(4) to be valid. In such a situation, the control module 32 may calculate the capacity at this point in time, and update the actual capacity value at block 214 to the newly calculated estimated capacity.

Alternatively, if the values of SOC(3) and/or SOC(4) do not fall within the values of SOC(1) and SOC(2), then the control module 32 may deem a capacity estimation from SOC(3) and/or SOC(4) invalid at block 236. In such a situation, the process of the flowchart 210 may restart at a different initial SOC value, or SOC(3) and/or SOC(4) may be calculated at a later time to determine whether a capacity value based on SOC(3) and/or SOC(4) is valid.

Figure 11:
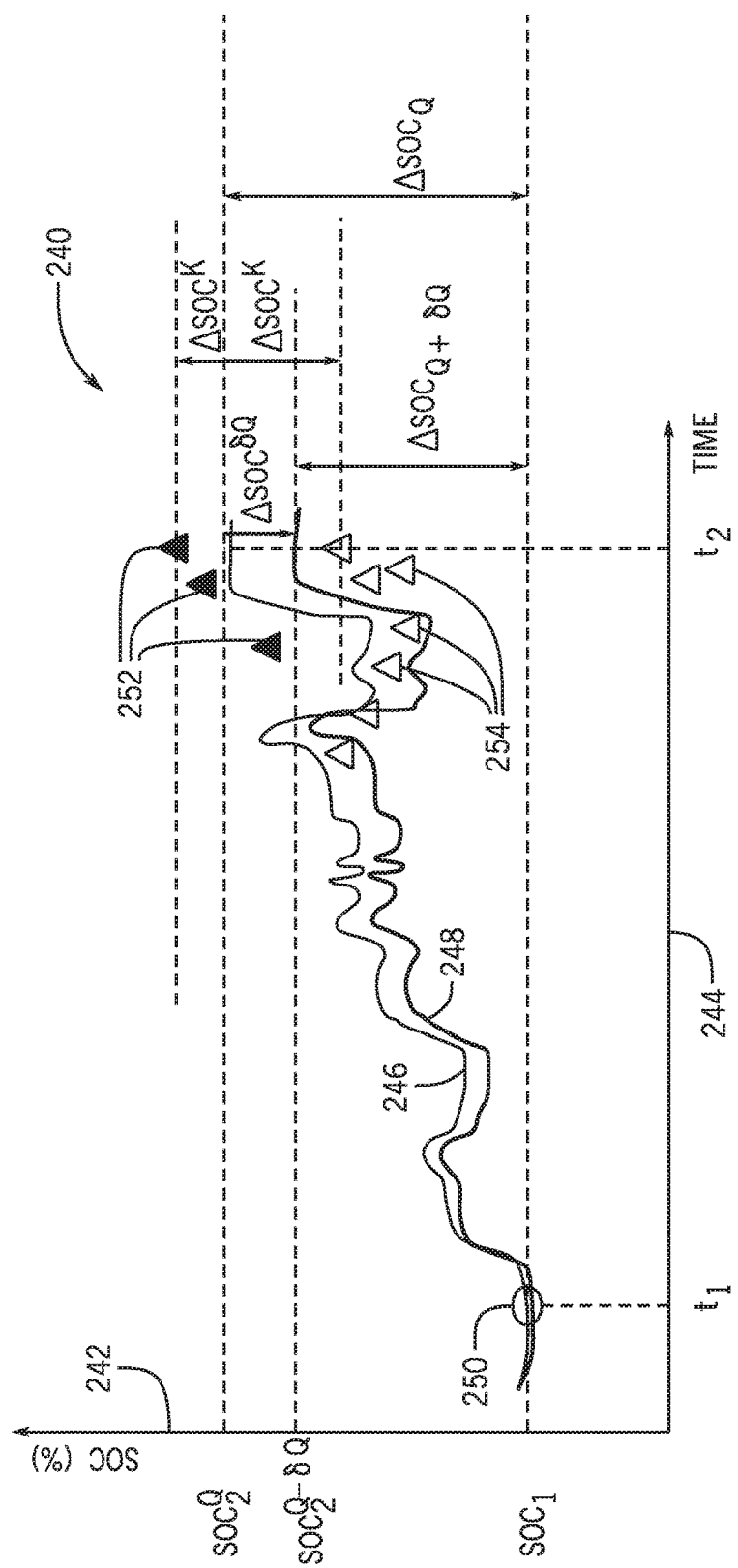
FIG. 11 is a chart depicting an embodiment of the process flow diagram of FIG. 10, in accordance with an embodiment.

Turning to FIG. 11, a chart 240 illustrates the process detailed in the flowchart 210 of FIG. 10. An ordinate 242 represents the SOC of the energy storage component 14 as a percentage. An abscissa 244 represents a time against which the SOC is measured. Line 246 represents the current integration of the energy storage component 14 using the actual capacity of the energy storage component, and line 248 represents the parallel current integration of the energy storage component 14 using the candidate capacity of the energy storage component 14, which, as illustrated, is five percent lower than the actual capacity of the energy storage component 14.

As illustrated, the parallel current integration process begins at time $t_1$ with an accurate initial SOC value 250. The accurate initial SOC value 250 may be obtained with an open circuit voltage (OCV) measurement and a comparison of the OCV measurement with an OCV to SOC look-up table. Additionally, the parallel current integration process may be performed until a time $t_2$. The time $t_2$ may represent a time at which a $\Delta SOC^Q$ (e.g., a state of charge swing) of the parallel current integration process is sufficient for an accurate verification of the estimated capacity of the energy storage component 14. For example, the state of charge swing may be a swing of approximately 20 percent for accurate verification of the estimated capacity. In other instances, the state of charge swing may be a swing of approximately 10 percent, 15 percent, or up to 25 percent or greater for accurate verification of the estimated capacity.

As the parallel integration process approaches time $t_2$, several SOC measurements 252 and 254 of the energy storage component calculated using a Kalman filter method, for example, are plotted. The dark colored SOC measurements 252 represent SOC measurements that are not valid for use with a capacity estimation update. For example, changes in the SOC (e.g., $\Delta SOC^k$) between the line 246 and the SOC measurements 252 are in the opposite direction compared to the SOC swing (e.g., $\Delta SOC^{\delta Q}$) of the parallel current integration lines 246 and 248. Accordingly, if the values of the dark colored SOC measurements 252 were calculated by the control module 32, the control module 32 would wait for a subsequent valid SOC measurement to update the capacity estimation.

Alternatively, the light colored SOC measurements 254 represent SOC measurements that are valid for use with a capacity estimation update. For example, changes in the SOC (e.g., $\Delta SOC^k$) between the line 246 and the SOC measurements 254 are in the same direction as the SOC swing (e.g., $\Delta SOC^{\delta Q}$) of the parallel current integration lines 246 and 248. Accordingly, if the values of the light colored SOC measurements 254 were calculated by the control module 32, the control module 32 would update the capacity estimation at the time that the light colored SOC measurements 254 were calculated.

One or more of the disclosed embodiments, alone or in combination, may provide one or more technical effects including determining battery time variant and time invariant variables, determining a state of charge of the battery, determining a state of health of the battery, and validating the state of health of the battery. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery system, comprising:
a battery configured to be coupled to an electrical system;
one or more sensors configured to measure battery parameters during operation of the battery system; and
a control module communicatively coupled to the one or more sensors, wherein the control module is programmed to:
  determine a first estimated state of charge of the battery based on a first estimated capacity of the battery, an initial state of charge of the battery, and current indicated by the battery parameters measured after a first time corresponding with the initial state of charge;
  determine a second estimated state of charge of the battery based on a second estimated capacity of the battery less than the first estimated capacity of the battery, the initial state of charge of the battery, and the current indicated by the battery parameters measured after the first time corresponding with the initial state of charge;
  determine a third estimated state of charge of the battery by executing a first Kalman filter based on the battery parameters measured at a second time after the first time corresponding with the initial state of charge;
  determine actual capacity of the battery based at least in part on the third estimated state of charge when the second estimated state of charge and the third estimated state of charge are both less than the first estimated state of charge or the second estimated state of charge and the third estimated state of charge are both greater than the first estimated state of charge; and control charging, discharging, or both of the battery based at least in part on the actual capacity of the battery.

2. The battery system of claim 1, wherein:
the first estimated capacity of the battery comprises a previously determined actual capacity of the battery; and
the second estimated capacity of the battery is five percent less than the previously determined actual capacity of the battery.

3. The battery system of claim 2, wherein the previously determined actual capacity of the battery was determined greater than two months before the first time.

4. The battery system of claim 1, wherein, to determine the first estimated state of charge of the battery, the control module is programmed to:
determine a charge throughput by integrating the current indicated by the battery parameters measured between the first time corresponding with the initial state of charge and the second time;
determine a first state of charge change based on ratio of the charge throughput to the first estimated capacity of the battery; and
determine the first estimated state of charge by applying the first state of charge change to the initial state of charge of the battery.

5. The battery system of claim 4, wherein, to determine the second estimated state of charge of the battery, the control module is programmed to:
determine a second state of charge change based on ratio of the charge throughput to the second estimated capacity of the battery; and
determine the second estimated state of charge by applying the second state of charge change to the initial state of charge of the battery.

6. The battery system of claim 1, wherein the control module is programmed to determine the third estimated state of charge of the battery when difference between the first estimate state of charge at the second time and the initial state of charge at the first time is greater than 20 percent.

7. The battery system of claim 6, wherein the control module is programmed to:
determine an open circuit voltage of the battery based at least in part on the battery parameters measured at the first time; and
determine the initial state of charge of the battery based at least in part on the open circuit voltage at the first image and an open circuit voltage to state of charge look-up table.

8. The battery system of claim 1, wherein, to determine the third estimated state of charge of the battery, the control module is programmed to:
determine the first Kalman filter based at least in part on an equivalent circuit model of the battery that describes relationship between the battery parameters and model parameter;
execute the first Kalman filter based on the battery parameters measured at the second time to determine an estimated open circuit voltage of the battery; and
determine the third estimated state of charge based on the estimated open circuit voltage of the battery at the second time.

9. The battery system of claim 8, wherein, to determine the actual capacity of the battery, the control module is programmed to:
determine a second Kalman filter based at least in part on relationship between capacity of the battery, state of charge change in the battery, and electric charge throughput of the battery during the state of charge change;
execute the second Kalman filter based on the battery parameters measured at the second time and the third estimated state of charge of the battery to determine one of a plurality of estimated battery capacities each determined based on based on a different set of a plurality of battery parameter sets; and
determine the actual capacity of the battery based at least in part on convergence of the plurality of estimated battery capacities.

10. The battery system of claim 9, wherein, to determine the actual capacity of the battery when the battery parameters determined at the second time are included in a most recent set of the plurality of battery parameter sets, the control module is programmed to:
execute the first Kalman filter each time one of the plurality of battery parameter sets is received to determine a plurality of estimated states of charge of the battery;
determine a maximum state of charge of the battery from the plurality of estimated states of charge;
determine a minimum state of charge of the battery from the plurality of estimated states of charge; and
set the actual capacity of the battery as the one of the plurality of estimated battery capacities determined based on the battery parameters measured at the second time when difference between the maximum state of charge and the minimum state of charge is greater than a state of charge swing threshold.

11. The battery system of claim 9, wherein, to test convergence of the plurality of estimated battery capacities, the control module is programmed to:
determine an estimated battery capacity mean after each time one of the plurality of estimated battery capacities is determined;
determine an estimated battery capacity variance after each time one of the plurality of estimated battery capacities is determined;
determine a ratio of the estimated battery capacity variance to the estimated battery capacity mean squared after each time one of the plurality of estimated battery capacities is determined to determine a plurality of variance to mean squared ratios; and
determine that the plurality of estimated battery capacities has converged on the actual capacity of the battery when:
each of the plurality of variance to mean squared ratios is less than a relative error tolerance value squared; and
number of the plurality of estimated battery capacities greater than a threshold number.

12. The battery system of claim 1, wherein, to control charging, discharging, or both of the battery, the control module is programmed to:
control charging of the battery;
control discharging of the battery; or
both based at least in part on a fourth estimated state of charge of the battery determined based on the actual capacity of the battery.

13. A method for operating a battery control module, comprising:
receiving, using the battery control module, battery parameters measured by one or more sensors coupled to a rechargeable battery;

determining, using the battery control module, a first estimated state of charge of the rechargeable battery based on a first estimated capacity of the rechargeable battery, an initial state of charge of the rechargeable battery, and current indicated by the battery parameters measured after a first time corresponding with the initial state of charge;

determining, using the battery control module, a second estimated state of charge of the rechargeable battery based on a second estimated capacity of the rechargeable battery less than the first estimated capacity of the rechargeable battery, the initial state of charge of the rechargeable battery, and the current indicated by the battery parameters measured after the first time corresponding with the initial state of charge;

determining, using the battery control module, a third estimated state of charge of the rechargeable battery by executing a first Kalman filter based on the battery parameters measured at a second time after the first time corresponding with the initial state of charge;

determining, using the battery control module, actual capacity of the rechargeable battery based at least in part on the third estimated state of charge when the second estimated state of charge and the third estimated state of charge are both less than the first estimated state of charge or the second estimated state of charge and the third estimated state of charge are both greater than the first estimated state of charge; and controlling, using the battery control module, charging, discharging, or both of the rechargeable battery based at least in part on the actual capacity of the rechargeable battery.

14. The method of claim 13, wherein determining the first estimated state of charge of the rechargeable battery comprises:

determining a charge throughput by integrating the current indicated by the battery parameters measured between the first time corresponding with the initial state of charge and the second time;

determining a first state of charge change based on ratio of the charge throughput to the first estimated capacity of the rechargeable battery; and determining the first estimated state of charge by applying the first state of charge change to the initial state of charge of the rechargeable battery.

15. The method of claim 14, wherein determining the second estimated state of charge of the rechargeable battery comprises:

determining a second state of charge change based on ratio of the charge throughput to the second estimated capacity of the rechargeable battery; and determine the second estimated state of charge by applying the second state of charge change to the initial state of charge of the rechargeable battery.

16. The method of claim 13, wherein determining the third estimated state of charge comprises:

determining the first Kalman filter based at least in part on an equivalent circuit model of the rechargeable battery that describes relationship between the battery parameters and model parameter;

executing the first Kalman filter based on the battery parameters measured at the second time to determine an estimated open circuit voltage of the rechargeable battery; and determine the third estimated state of charge based on the estimated open circuit voltage of the rechargeable battery at the second time.

17. The method of claim 16, wherein determining the actual capacity of the rechargeable battery comprises:

determining a second Kalman filter based at least in part on relationship between capacity of the rechargeable battery, state of charge change in the rechargeable battery, and electric charge throughput of the rechargeable battery during the state of charge change;

executing the second Kalman filter based on the battery parameters measured at the second time and the third estimated state of charge of the rechargeable battery to determine one of a plurality of estimated battery capacities each determined based on a different set of a plurality of battery parameter sets; and determining the actual capacity of the rechargeable battery based at least in part on convergence of the plurality of estimated battery capacities.

18. The method of claim 17, wherein determining the actual capacity of the rechargeable battery when the battery parameters determined at the second time are included in a most recent set of the plurality of battery parameter sets comprises:

executing the first Kalman filter each time one of the plurality of battery parameter sets is received to determine a plurality of estimated states of charge of the rechargeable battery;

determining a maximum state of charge of the rechargeable battery from the plurality of estimated states of charge;

determining a minimum state of charge of the rechargeable battery from the plurality of estimated states of charge; and setting the actual capacity of the rechargeable battery as the one of the plurality of estimated battery capacities determined based on the battery parameters determined at the second time when difference between the maximum state of charge and the minimum state of charge is greater than a state of charge swing threshold.

19. The method of claim 17, wherein determining the actual capacity of the rechargeable battery comprises:

determining an estimated battery capacity mean after each time one of the plurality of estimated battery capacities is determined;

determining an estimated battery capacity variance after each time one of the plurality of estimated battery capacities is determined;

determining a ratio of the estimated battery capacity variance to the estimated battery capacity mean squared after each time one of the plurality of estimated battery capacities is determined to determine a plurality of variance to mean squared ratios; and determining that the plurality of estimated battery capacities has converged on the actual capacity of the rechargeable battery when:

each of the plurality of variance to mean squared ratios is less than a relative error tolerance value squared; and number of the plurality of estimated battery capacities is greater than a threshold number.

20. A battery module configured to be implemented in a vehicle, comprising:

a housing;

a first terminal and a second terminal coupled to the housing;

a rechargeable battery disposed in the housing and electrically coupled to the first terminal and the second terminal;

a battery control module displayed in the housing, wherein the battery control module is configured to:
 receive battery parameters measured by one or more sensors;
 determine a first estimated state of charge of the battery based on a first estimated capacity of the battery module, an initial state of charge of the battery module, and current indicated by the battery parameters measured after a first time corresponding with the initial state of charge;
 determine a second estimated state of charge of the battery module based on a second estimated capacity of the battery module less than the first estimated capacity of the battery module, the initial state of charge of the battery module, and the current indicated by the battery parameters after the first time corresponding with the initial state of charge;
 determine a third estimated state of charge of the battery by executing a first Kalman filter based on the battery parameters measured at a second time after the first time corresponding with the initial state of charge;
 determine actual capacity of the battery module based at least in part on the third estimated state of charge when the second estimated state of charge and the third estimated state of charge are both less than the first estimated state of charge or the second estimated state of charge and the third estimated state of charge are both greater than the first estimated state of charge; and
 indicate the actual capacity of the battery module to enable operation of the battery module to be controlled based at least in part on the actual capacity of the battery module.

21. The battery module of claim 20, wherein:
to determine the first estimated state of charge, the battery control module is configured to:
 determine a charge throughput by integrating the current indicated by the battery parameters measured between the first time corresponding with the initial state of charge and the second time;
 determine a first state of charge change based on a first ratio of the charge throughput to the first estimated capacity of the battery module; and
 determine the first estimated state of charge by applying the first state of charge change to the initial state of charge of the battery module; and
to determine the second estimated state of charge, the battery control module is configured to:
 determine a second state of charge change based on a second ratio of the charge throughput to the second estimated capacity of the battery module; and
 determine the second estimated state of charge by applying the second state of charge change to the initial state of charge of the battery module.

22. The battery module of claim 20, wherein:
to determine the third estimated state of charge, the battery control module is configured to:
 determine the first Kalman filter based at least in part on an equivalent circuit model of the battery module that describes relationship between the battery parameters and model parameter;
 execute the first Kalman filter based on the battery parameters measured at the second time to determine an estimated open circuit voltage of the battery module; and
 determine the third estimated state of charge based on the estimated open circuit voltage of the battery module at the second time; and
to determine the actual capacity, the battery control module is configured to:
 determine a second Kalman filter based at least in part on relationship between capacity of the battery module, state of charge change in the battery module, and electric charge throughput of the battery module during the state of charge change;
 execute the second Kalman filter based on the battery parameters measured at the second time and the third estimated state of charge of the battery module to determine one of a plurality of estimated battery capacities each determined based on battery parameters measured at a different time; and
 determine the actual capacity of the battery module based at least in part on convergence of the plurality of estimated battery capacities.

23. The battery module of claim 20, wherein, to indicate the actual capacity of the battery module, the battery control module is configured to store the actual capacity of the battery module in memory accessible by a vehicle control unit to enable the vehicle control unit to:
 control charging of the battery module;
 control discharging of the battery module; or
 both based at least in part on the actual capacity of the battery module, a fourth-estimated state of charge determined based on the actual capacity of the battery module, or both.

* * * * *

UNITED STATES PATENT AND TRADEMARK OFFICE
CERTIFICATE OF CORRECTION

| | | |
|---|---|---|
| PATENT NO. | : 10,048,321 B2 | Page 1 of 1 |
| APPLICATION NO. | : 15/048853 | |
| DATED | : August 14, 2018 | |
| INVENTOR(S) | : Christian Kuper et al. | |

It is certified that error appears in the above-identified patent and that said Letters Patent is hereby corrected as shown below:

In the Specification

In Column 1, Line 32, delete "full hybrid systems" and insert -- full hybrid electric vehicles --, therefor.

In Column 1, Line 35, delete "mild hybrid systems" and insert -- mild hybrid electric vehicles --, therefor.

In Column 2, Line 42, delete "process" and insert -- process. --, therefor.

In Column 3, Line 9, delete "DRAWINGS" and insert -- BRIEF DESCRIPTION OF DRAWINGS --, therefor.

In Column 3, Line 14, delete "is perspective" and insert -- is a perspective --, therefor.

In Column 22, Line 8, delete "may used," and insert -- may be used, --, therefor.

In the Claims

In Column 26, Line 8, in Claim 9, delete "based on based on" and insert -- based on --, therefor.

Signed and Sealed this
Twenty-ninth Day of January, 2019

Andrei Iancu
*Director of the United States Patent and Trademark Office*